United States Patent
Nakanishi

(10) Patent No.: US 6,933,671 B2
(45) Date of Patent: *Aug. 23, 2005

(54) DISPLAY SYSTEM INCLUDING FUNCTIONAL LAYERS AND ELECTRONIC DEVICE HAVING SAME

(75) Inventor: Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 85 days.

This patent is subject to a terminal disclaimer.

(21) Appl. No.: 10/320,429

(22) Filed: Dec. 17, 2002

(65) Prior Publication Data

US 2003/0156079 A1 Aug. 21, 2003

(30) Foreign Application Priority Data

Dec. 17, 2001 (JP) ..................................... 2001-383022

(51) Int. Cl.[7] .............................. H01J 1/62; H01J 63/04; H01J 17/49; G09G 3/10; B41J 2/205
(52) U.S. Cl. ..................... 313/500; 313/504; 313/505; 313/506; 313/509; 313/585; 313/586; 313/587; 315/169.1; 315/169.2; 315/169.3; 347/15; 347/19; 347/33; 347/101; 347/105; 347/106
(58) Field of Search ................................. 313/500, 501, 313/504, 506, 585–587, 509; 315/169.1–169; 347/16, 19, 33, 101, 105, 106

(56) References Cited

U.S. PATENT DOCUMENTS

| | | | |
|---|---|---|---|
| 6,290,352 B1 | 9/2001 | Marumoto et al. | |
| 6,304,670 B1 | 10/2001 | Berestov | |
| 6,312,771 B1 | 11/2001 | Kashiwazaki et al. | |
| 6,341,862 B1 | 1/2002 | Miyazaki et al. | |
| 6,342,321 B1 | 1/2002 | Sakamoto et al. | |
| 6,364,450 B1 | 4/2002 | Yamaguchi et al. | |
| 6,380,672 B1 | 4/2002 | Yudasaka | |
| 6,386,700 B1 | 5/2002 | Akahira | |
| 6,394,578 B1 | 5/2002 | Akahira et al. | |
| 6,476,419 B1 | 11/2002 | Yasuda | |
| 6,545,424 B2 * | 4/2003 | Ozawa | 315/169.3 |
| 6,680,577 B1 * | 1/2004 | Inukai et al. | 315/169.3 |
| 2003/0146710 A1 * | 8/2003 | Nakanishi | 315/169.3 |

FOREIGN PATENT DOCUMENTS

| | | |
|---|---|---|
| EP | 0 984 303 A1 | 3/2000 |
| EP | 1 209 744 A2 | 5/2002 |
| JP | 2000-231347 | 8/2000 |
| JP | A-2000-275658 | 10/2000 |
| KR | 2001-0014476 | 2/2001 |
| WO | WO 99/10862 | 3/1999 |

* cited by examiner

Primary Examiner—Karabi Guharay
Assistant Examiner—Matt Hodges
(74) Attorney, Agent, or Firm—Oliff & Berridge, PLC

(57) ABSTRACT

The invention provides a display system for displaying images and an electronic device equipped with the display system. The display system can include a first electrode region in which first electrodes connected to switching elements are arranged on a substrate in a matrix, and light-emitting power-supply lines that are arranged around the first electrode region and are connected to the first electrodes. Functinal layers are formed over the first electrodes, and a second electrode is formed at least over the functional layers. Each light-emitting power-supply line and the second electrode have a first capacitor therebetween.

14 Claims, 13 Drawing Sheets

DISPLAY SYSTEM INCLUDING FUNCTIONAL LAYERS AND ELECTRONIC DEVICE HAVING SAME

BACKGROUND OF THE INVENTION

1. Field of Invention

The present invention relates to a display system including an organic electroluminescent material and relates to an electronic device.

2. Description of Related Art

Recently, color display systems having a luminescent layer including a luminescent material, such as an organic fluorescent material being disposed between a pixel electrode (anode) and a cathode have been developed. Particularly, an organic EL display system including a luminescent material, such as an organic electroluminescent (organic EL) material has been developed.

A conventional display system (organic EL display system) will now be described with reference to the accompanying drawing. FIG. 13 shows a wiring structure of the conventional display system. The conventional display system has a plurality of scanning lines 901, a plurality of signal lines 902 extending in the direction that intersects the scanning lines 901, and a plurality of light-emitting power-supply lines 903 extending in parallel to the signal lines 902. In the conventional display system, a pixel region A is arranged for each intersecting point of each scanning line 901 and each signal line 902.

Each signal line 902 is connected to a data side-driving circuit 904 equipped with a shift register, a level shifter, a video line, and an analog switch. Each scanning line 901 is connected to scan-side driving circuits 905 and 905' each equipped with another shift register and another level shifter.

Each pixel region A can include a switching thin-film transistor 912, in which scanning signals are transmitted to the gate electrode through the scanning line 901; a capacitor Cap for storing pixel signals transmitted from the signal line 902 through the switching thin-film transistor 912, a current thin-film transistor 923 in which the pixel signals stored in the capacitor Cap are transmitted to the gate electrode, a pixel electrode 911 to which a driving current is supplied from each light-emitting power-supply line 903 when the pixel electrode 911 is electrically connected to the light-emitting power-supply line 903 through the current thin-film transistor 923, and a light-emitting element 910 disposed between the pixel electrode 911 and a cathode 913. The cathode 913 is connected to a cathode power-supply circuit 931.

The light-emitting element 910 has three types of light-emitting sub-elements including a red light-emitting sub-element 910R, a green light-emitting sub-element 910G, and a blue light-emitting sub-element 910B, which are arranged in a stripe pattern.

Red, green, and blue light-emitting power-supply lines 903R, 903G, and 903B are connected to the red, green, and blue light-emitting sub-elements 910R, 910G, and 910B, respectively, through each current thin-film transistor 923 and are connected to a light-emitting power-supply circuit 932. Since the light-emitting element 910 needs different driving potentials depending on the color, each light-emitting power-supply line is connected to a corresponding color light-emitting sub-element.

According to the above configuration, when each scanning line 901 is energized to turn each switching thin-film transistor 912 on, a potential applied to each signal line 902 at that time is stored in the capacitor Cap and the current thin-film transistor 923 is turned on or turned off depending on the state of the capacitor Cap. Subsequently, a current is supplied from the red, green, and blue light-emitting power-supply lines 903R, 903G, and 903B to the pixel electrode 911 through the channel of the current thin-film transistor 923, and a driving current is supplied to the cathode 913 through the light-emitting element 910. The light-emitting element 910 emits light depending on an applied potential.

SUMMARY OF THE INVENTION

In order to make the light-emitting element 910 emit light with stability, it is needed to minimize change in the potential of a driving current supplied to the pixel electrode 911 from each light-emitting power-supply line 903.

However, in the conventional display system, since a relatively large driving current must be supplied to the light-emitting element 910 in order to emit light, the potential of a driving current significantly changes depending on the working condition of the display system in some cases. Therefore, images cannot be normally displayed due to faults in the light-emitting function of the light-emitting element 910.

The present invention has been developed in order to solve the above problems, and it is an object of the present invention to provide a display system in which a driving current having a stable potential is supplied from a light-emitting power-supply line to a pixel electrode and to provide electronic devices equipped with such a display system.

The present invention provides a display system that can include a substrate, a first electrode region having switching elements and first electrodes that are connected to the switching elements and are arranged on the substrate in a matrix, and light-emitting power-supply lines that are arranged around the first electrode region and are connected to the first electrodes, functional layers that are formed over the first electrodes, and a second electrode of which a part is formed at least over the functional layers, and a first capacitor being formed between the light-emitting power supply line and the second electrode.

According to the above display system, each first capacitor is located between each light-emitting power-supply line and the second cathode. Therefore, when the potential of a driving current flowing in the light-emitting power-supply lines is lowered, charges accumulated in the first capacitors are supplied to the light-emitting power-supply lines, that is, the charges compensate the shortage of the potential of driving current, to suppress change in potential. Thus, the display system can normally display images.

In the above-mentioned display system of the present invention, each light-emitting power-supply line and the second electrode face each other to form the first capacitor outside the first electrode region.

According to the above display system, since the light-emitting power-supply line faces the second electrode outside the first electrode region, the distance between the light-emitting power-supply line and the second electrode is small, and therefore the quantity of charges accumulated in the first capacitor can be increased. Thus, change in the potential of a driving current can be reduced to normally display images.

Furthermore, in the display system of the present invention, each light-emitting power-supply line and the second electrode preferably have a first interlayer insulating layer therebetween.

The above-mentioned display system of the present invention can further include an actual display region including the first electrodes and a dummy region that is arranged around the actual display region and does not contribute to display. The second electrode covers at least the actual display region and the dummy region, and each light-emitting power-supply line and the second electrode face each other with the dummy region disposed therebetween to form the first capacitor.

According to the display system, the dummy region surrounds the actual display region and the light-emitting power-supply lines each face the second electrode with the dummy region located therebetween, the light-emitting power-supply lines are located under the dummy region. Therefore, there is no need to additionally provide an area for arranging the light-emitting power-supply lines outside the light-emitting element region, thereby relatively expanding the area of the actual display region.

In the display system of the present invention, the dummy region preferably includes dummy functional layers and dummy banks, and the dummy functional layers preferably have a thickness smaller than that of the dummy banks.

According to the above configuration, since part of the second cathode on each dummy functional layer 210 is closer to each light-emitting power-supply line than another part of the second cathode on each dummy bank, the quantity of charges accumulated in the first capacitors can be increased. Therefore, change in the potential of a driving current can be reduced to normally display images.

In the display system of the present invention, each light-emitting power-supply line and each dummy functional layer of the dummy region preferably have the first interlayer insulating layer therebetween.

In the above-mentioned display system of the present invention, the light-emitting power-supply lines each have a first line and a second line facing each other with a second interlayer insulating layer therebetween, each first line is disposed at the same hierarchical level as that of lines of the second electrode, and each first line and each line of the second electrode have a second capacitor therebetween.

According to the above display system, the first line and the line of the second electrode have the second capacitor therebetween. Therefore, when the potential of a driving current flowing in the light-emitting power-supply lines is lowered, charges accumulated in the second capacitors are supplied to the light-emitting power-supply lines to suppress change in potential. Thus, the display system can normally display images.

In the above-mentioned display system of the present invention, each functional layer includes a hole injection/transport layer and a light-emitting layer that is disposed adjacent to the hole injection/transport layer and comprises an organic electroluminescent material.

According to the above display system, since the functional layer includes the hole injection/transport layer. And a driving current in which change in potential is slight applied to the functional layer, bright and correct color can be displayed.

A display system according to the present invention includes a substrate, a first electrode region having switching elements and first electrodes that are connected to the switching elements and are disposed on the substrate, and light-emitting power-supply lines that are arranged around the first electrode region and are connected to the first electrodes, functional layers that are formed over the first electrodes, and a second electrode of which part is formed at least over the functional layers, and a first interlayer insulating layer is formed over the emitting power-supply lines.

In the above-mentioned display system of the present invention, each light-emitting power-supply line and the second electrode face each other with the first interlayer insulating layer located therebetween to form the first capacitor outside the first electrode region.

The above-mentioned display system of the present invention further includes an actual display region including the first electrodes and a dummy region that is arranged around the actual display region and does not contribute to display. The second electrode covers at least the actual display region and the dummy region, each light-emitting power-supply line and the second electrode face each other with the dummy region disposed therebetween, and the dummy region has the first interlayer insulating layer.

In the above-mentioned display system of the present invention, the dummy region can include dummy functional layers and dummy banks, and the dummy functional layers have a thickness smaller than that of the dummy banks.

In the above-mentioned display system of the present invention, the light-emitting power-supply lines each have a first line and a second line facing each other with a second interlayer insulating layer therebetween, each first line is disposed at the same hierarchical level as that of lines of the second electrode, and each first line and each line of the second electrode have a second capacitor therebetween.

In the above-mentioned display system of the present invention, each functional layer can include a hole injection/transport layer and a light-emitting layer that is disposed adjacent to the hole injection/transport layer and have an organic electroluminescent material.

An electronic device of the present invention includes any one of the display systems described above. Such an electronic device can normally display images.

BRIEF DESCRIPTION OF THE DRAWINGS

The invention will be described with reference to the accompanying drawings wherein like numerals reference like elements, and wherein.

DETAILED DESCRIPTION OF PREFERRED EMBODIMENTS

Figure 1:
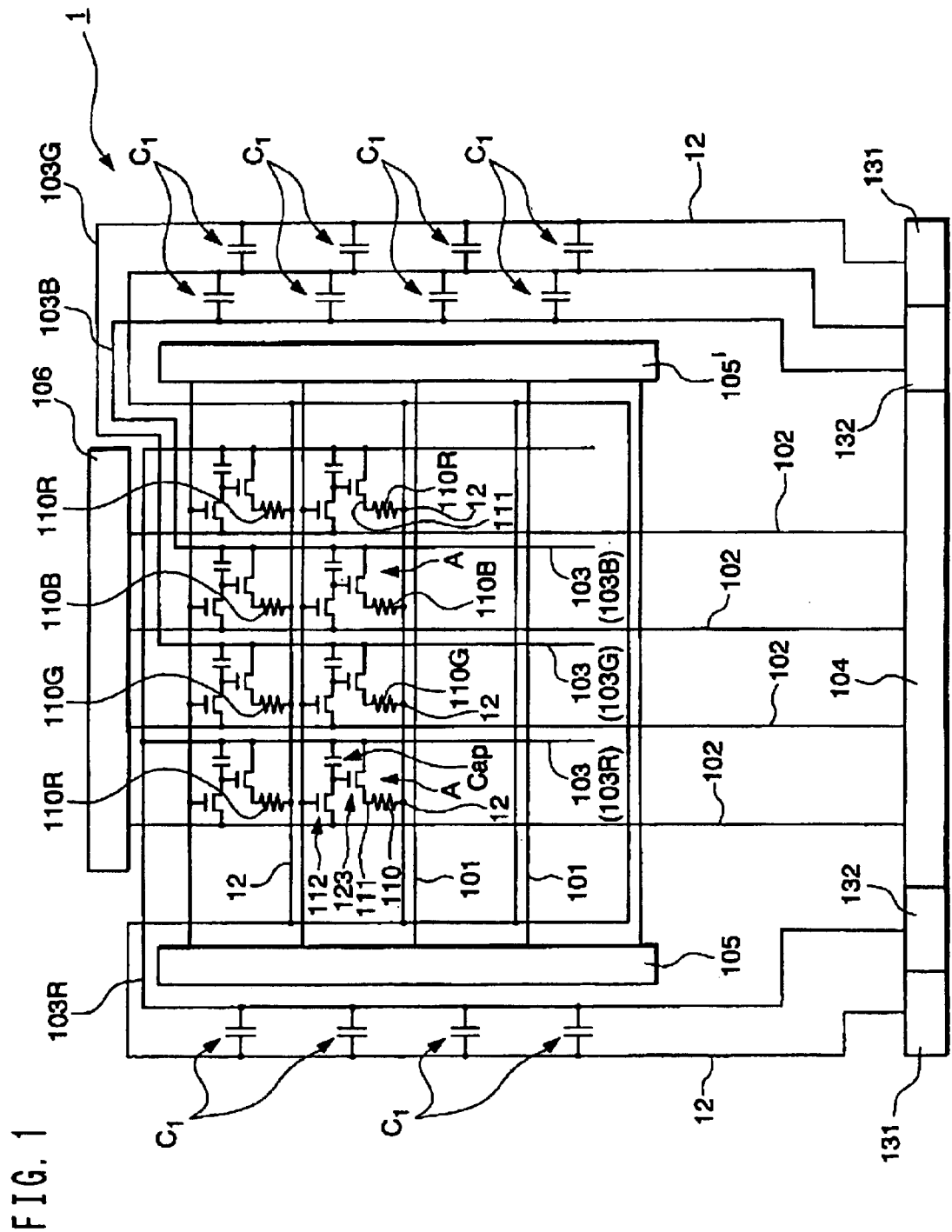
FIG. 1 is a schematic plan view showing a wiring structure of a display system of a first embodiment according to the present invention.

A first embodiment of the present invention will now be described with reference to the accompanying drawings. It should be understood that this is merely one of the embodiment of the present invention, and the present invention is not limited to this embodiment. Within the scope of the present invention, various changes may be performed. In the following drawings, in order to show each layer and member in the drawings on a recognizable scale, different scales are used for showing the layers and members.

FIG. 1 is a schematic plan view showing a wiring structure of a display system of this embodiment. The display system 1 shown in FIG. 1 is an active matrix-type organic EL display system equipped with a thin-film transistor functioning as a switching element. As shown in FIG. 1, the display system 1 of this embodiment includes a plurality of scanning lines 101, a plurality of signal lines 102 extending in the direction that intersects the scanning lines 101, and a plurality of light-emitting power-supply lines 103 extending in parallel to the signal lines 102. In the display system, each pixel region A is arranged for each intersecting point of each scanning line 101 and each signal line 102.

The signal line 102 is connected to a data side-driving circuit 104 equipped with a shift register, a level shifter, a video line, and an analog switch. The signal line 102 is further connected to an inspection circuit 106 equipped with a thin-film transistor. The scanning line 101 is further connected to scanning line driving circuits 105 and 105' each equipped with another shift register and another level shifter.

Each pixel region A includes a switching thin-film transistor 112 in which scanning signals are transmitted to the gate electrode through the scanning line 101, a capacitor Cap for storing pixel signals transmitted from the signal line 102 through the switching thin-film transistor 112, a current thin-film transistor (switching element) 123 in which the pixel signals stored in the capacitor Cap are transmitted to the gate electrode, a pixel electrode (first electrode) 111 to which a driving current is supplied from each light-emitting power-supply line 103 when the pixel electrode 111 is electrically connected to the light-emitting power-supply line 103 through the current thin-film transistor 123, and a functional layer 110 disposed between the pixel electrode 111 and a cathode (second electrode) 12. The cathode 12 is connected to a cathode power-supply circuit 131.

Each functional layer 110 includes a hole injection/transport layer and a light-emitting layer that can further an organic electroluminescent material and is adjacent to the hole injection/transport layer. Each light-emitting layer includes three types of light-emitting sub-layers consisting of a red light-emitting sub-layer 110R displaying red, a green light-emitting sub-layer 110G displaying green, and a blue light-emitting sub-layer 110B displaying blue, which are arranged in a stripe pattern.

Red, green, and blue light-emitting power-supply lines 103R, 103G, and 103B are connected to the red, green, and blue light-emitting sub-layers 110R, 110G, and 110B, respectively, through each current thin-film transistor 123. They can further be connected to a light-emitting power-supply circuit 132. Since the light-emitting layer 110 needs different driving potentials depending on the colors to be displayed, each light-emitting power-supply line is connected to each corresponding color light-emitting sub-layer.

First capacitors C1 are disposed between the cathode 12 and the red, green, and blue light-emitting power-supply lines 103R, 103G, and 103B. When the display system 1 is operated, charges are accumulated in the first capacitors C1. When the potential of a driving current flowing in the light-emitting power-supply lines 103 is lowered during the operation of the display system 1, the accumulated charges are supplied to the light-emitting power-supply lines 103 to suppress a change in potential. Thus, the display system 1 can normally display images.

In the display system 1, when the scanning lines 101 are energized to turn the switching thin-film transistors 112 on, a potential applied to the signal lines 102 at that time is accumulated in the capacitors Cap to turn the current thin-film transistors 123 on or off depending on the potential of the capacitors Cap. Subsequently, a driving current is supplied from the red, green, and blue light-emitting power-supply lines 103R, 103G, and 103B to the pixel electrodes 111 through the channels of the current thin-film transistors 123, and the current is supplied to the cathode (second electrode) 12 through the red, green, and blue light-emitting sub-layers 110R, 110G, and 110B. The functional layers 110 emit light depending on an applied potential.

Figure 2:
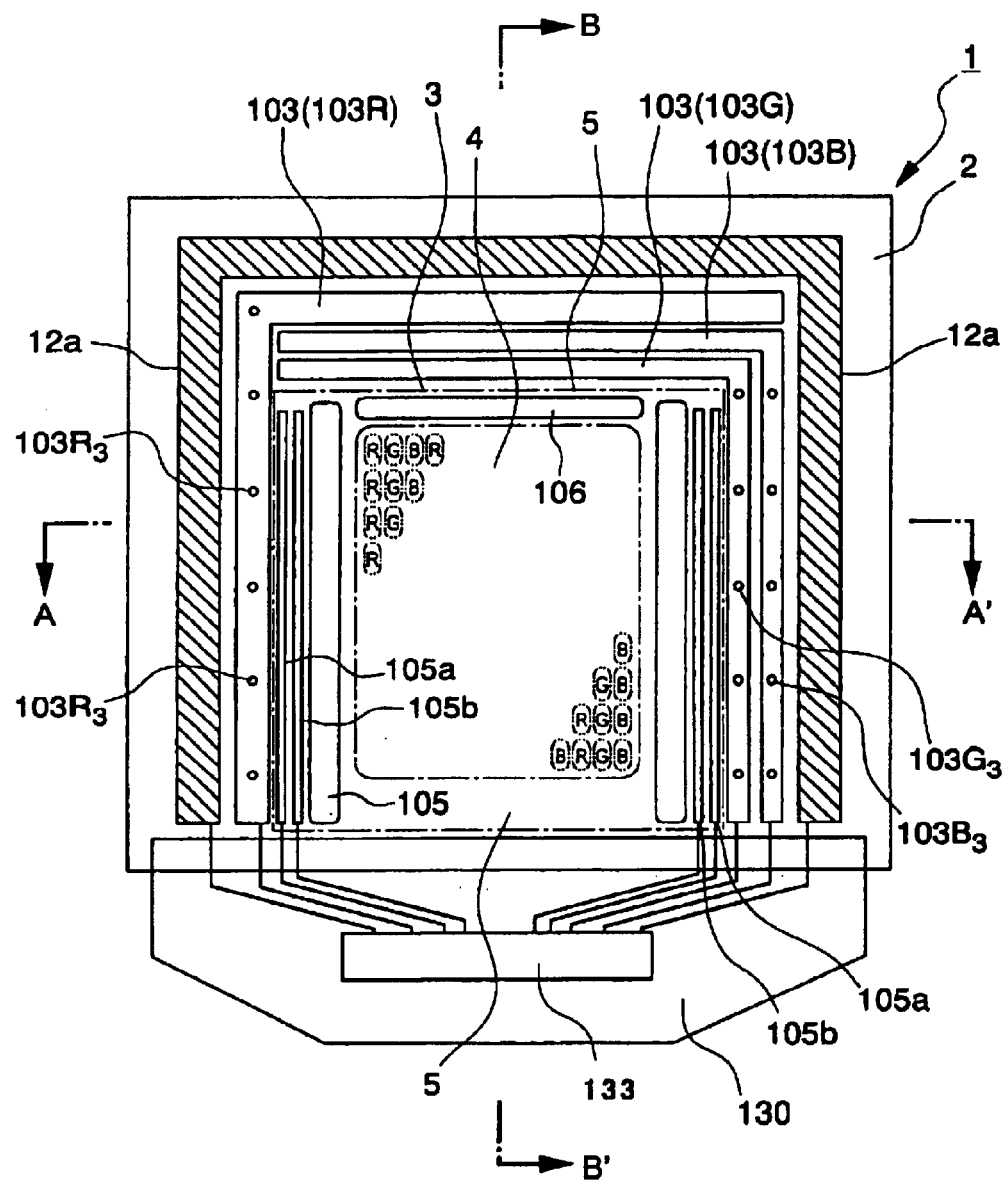
FIG. 2 is a schematic plan view showing the display system of the first embodiment of the present invention.
Figure 3:
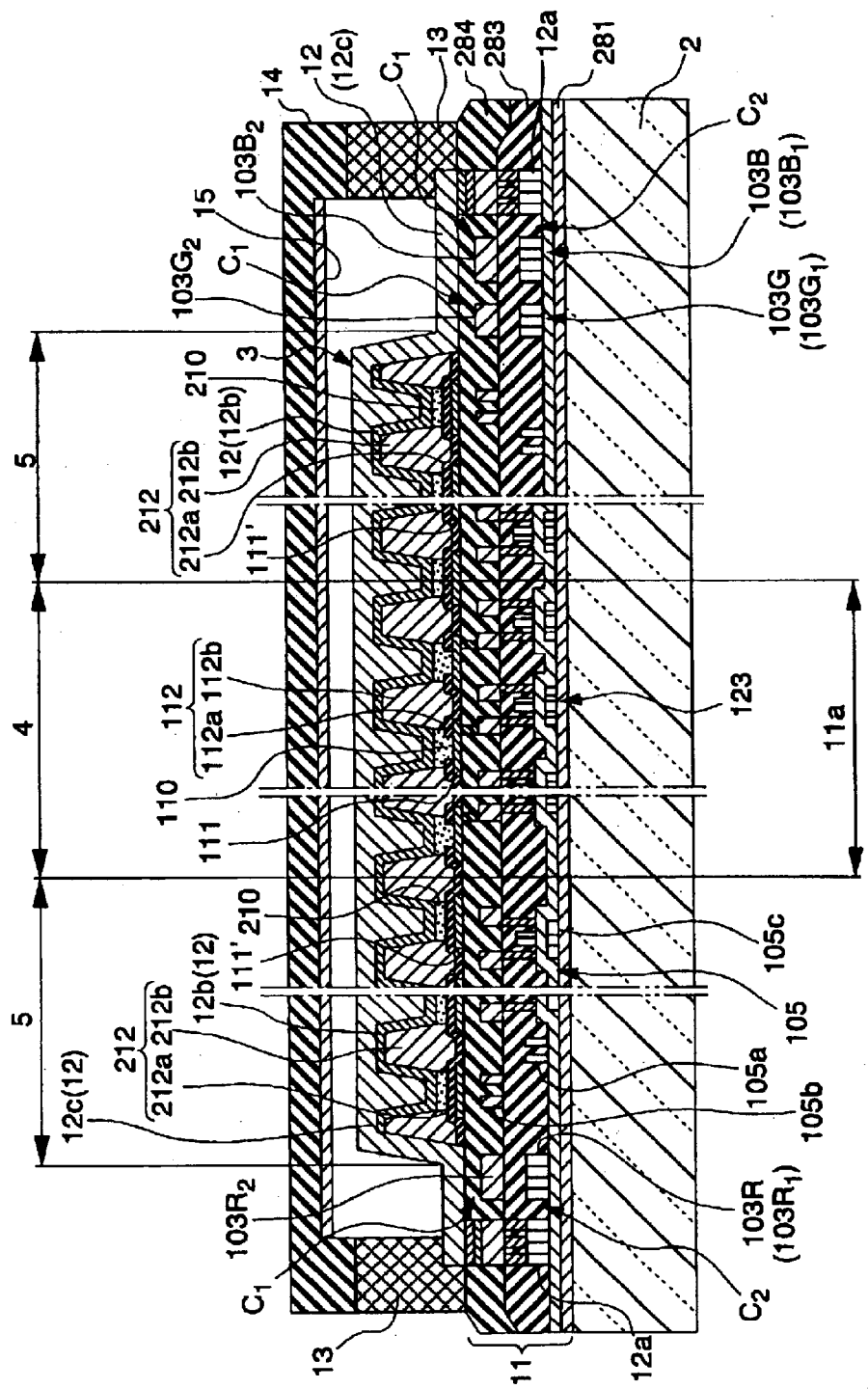
FIG. 3 is a sectional view taken along the line A–A' of FIG. 2.
Figure 4:
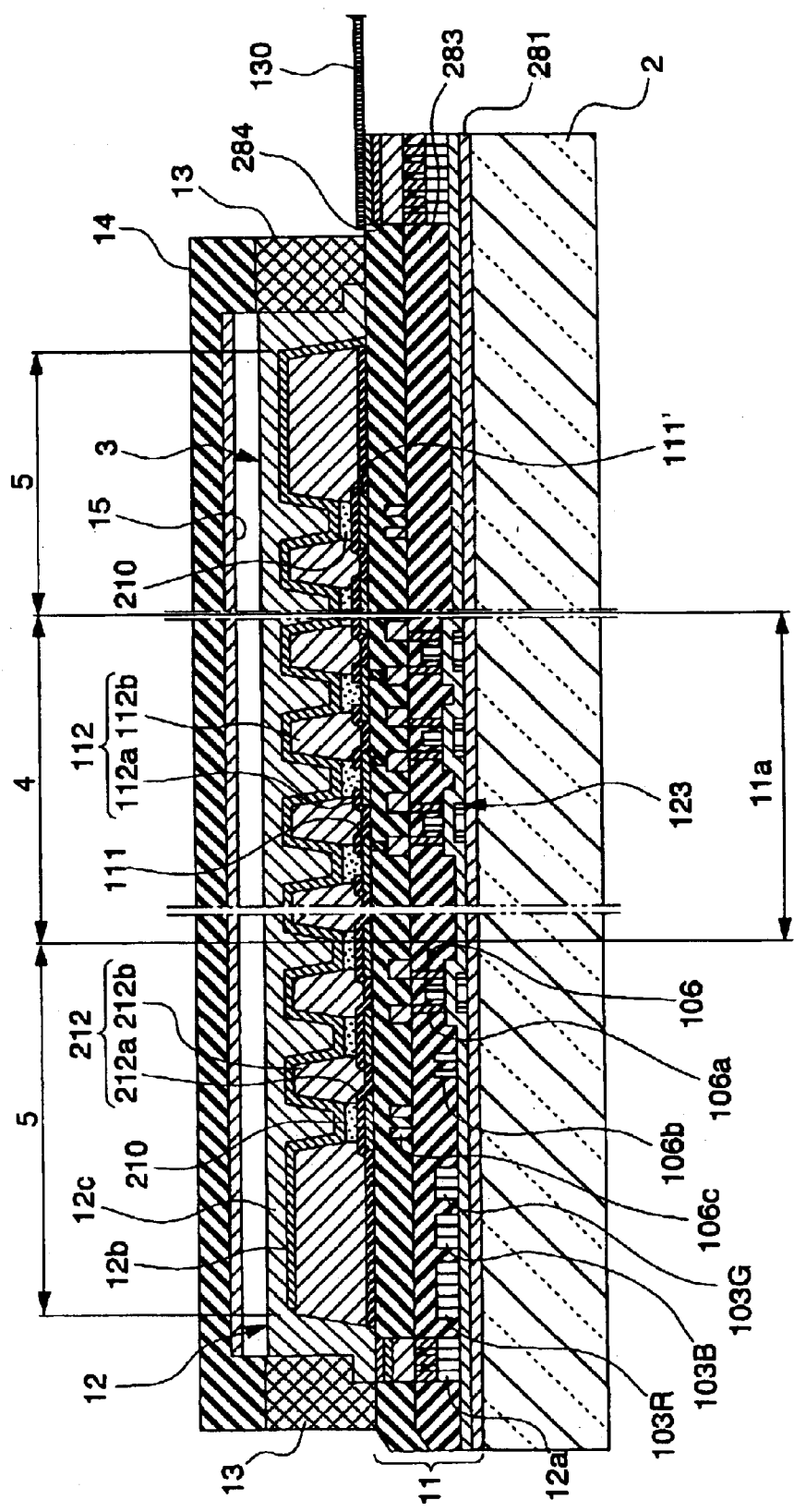
FIG. 4 is a sectional view taken along the line B–B' of FIG. 2.

A particular configuration of the display system 1 of this embodiment will now be described with reference to FIGS. 2 to 4. FIG. 2 is a schematic plan view showing the display system 1 of this embodiment, FIG. 3 is a sectional view taken along the line A–A' of FIG. 2, and FIG. 4 is a sectional view taken along the line B–B' of FIG. 2.

As shown in FIG. 2, the display system 1 of this embodiment includes a transparent substrate 2 having glass, or the like, a pixel electrode region (first electrode region), which is not shown, having pixel electrodes (first electrodes) that are connected to the current thin-film transistors (switching elements) 123, which are not shown, and are arranged on the substrate 2 in a matrix, the light-emitting power-supply lines 103 (103R, 103G, and 103B) that are arranged around the pixel electrode region and are connected to corresponding pixel electrodes, and a display pixel portion 3 (the area surrounded by the one-dot chain line in the figure) that is located on at least the pixel electrode region and has substantially a rectangular shape when viewed from above. The display pixel portion 3 is partitioned into an actual display region 4 (the area surrounded by the two-dot chain line in the figure) located at the center and a dummy region 5 (the area between the dotted-chain line and the two-dot chain) disposed around the actual display region 4.

The scanning line driving circuits 105 and 105' described above are arranged at both sides of the actual display region 4. The scanning line driving circuits 105 and 105' are disposed on the back (the side close to the substrate 2) of the dummy region 5. Furthermore, a scanning line-driving circuit control signal line 105a and a scanning line-driving circuit power-supply line 105b connected to the scanning line driving circuits 105 and 105' are disposed on the back of the dummy region 5.

The inspection circuit 106 described above is disposed above the actual display region 4. The inspection circuit 106 is located on the back (the side close to the substrate 2) of the dummy region 5. Display systems can be checked using the inspection circuit 106 if the display systems meet the standards and have no defects during the manufacturing process and at the point of delivery.

As shown in FIG. 2, the red, green, and blue light-emitting power-supply lines 103R, 103G, and 103B are arranged around the dummy region 5. In FIG. 2, the red, green, and blue light-emitting power-supply lines 103R, 103G, and 103B extend upward from the bottom of the substrate 2 along the scanning line-driving circuit power-supply line 105b, bend at the end of the scanning line-driving circuit power-supply line 105b to extend along the periphery of the dummy region 5, and are connected to the pixel electrodes, which are not shown, located in the actual display region 4.

The substrate 2 has a cathode line 12a connected to the cathode 12. The cathode line 12a has substantially a C-shape when viewed from above and surrounds the red, green, and blue light-emitting power-supply lines 103R, 103G, and 103B on three sides.

A polyimide tape 130 is disposed at an end of the substrate 2, and a control IC 133 is disposed on the polyimide tape 130. The control IC 133 contains the data side-driving circuit 104, the cathode power-supply circuit 131, and the light-emitting power-supply circuit 132, which are shown in FIG. 1.

As shown in FIGS. 3 and 4, the substrate 2 has a circuit portion 11 thereon and the display pixel portion 3 is disposed on the circuit portion 11. A sealing material 13 is disposed above the substrate 2 and surrounds the display pixel portion 3 in a loop, and a sealing substrate 14 is disposed on the sealing material 13. The sealing substrate 14 including glass, metal, or resin is fixed to the substrate 2 with the sealing material 13 located therebetween. An absorbent 15 is placed on the lower face of the sealing substrate 14. The absorbent 15 absorbs moisture and oxygen leaking into the space between the display pixel portion 3 and the sealing substrate 14. A getter may be used instead of the absorbent 15. The sealing material 13 comprises, for example, a thermosetting resin or an ultraviolet-curing resin, and preferably an epoxy resin, which is a thermosetting resin, in particular.

A pixel electrode region 11a is located at the center area of the circuit portion 11. The pixel electrode region 11a has the current thin-film transistors 123 and the pixel electrodes 111 connected to the current thin-film transistors (switching elements) 123. A base-protecting layer 281, a second interlayer insulating layer 283, and a first interlayer insulating layer 284 are disposed on the substrate 2 in that order, and the current thin-film transistors 123 are placed on the base-protecting layer 281. The pixel electrodes 111 are placed on the first interlayer insulating layer 284.

The circuit portion 11 can further include the capacitors Cap and switching thin-film transistors 142, which are not shown in FIGS. 3 and 4.

In FIG. 3, the scanning line driving circuits 105 and 105' are placed at both sides of the pixel electrode region 11a. In FIG. 4, the inspection circuit 106 is placed at the left side of the pixel electrode region 11a.

The scanning line driving circuits 105 and 105' each have a first thin-film transistor 105c, which is a N-channel type or a P-channel type. Each first thin-film transistor 105c has substantially the same structure as that of the current thin-film transistors 123 except for that the first thin-film transistor 105c is not connected to the pixel electrodes 111.

The inspection circuit 106 has a second thin-film transistor 106a. The second thin-film transistor 106a also has substantially the same structure as that of the current thin-film transistors 123 except for that the second thin-film transistor 106a is not connected to the pixel electrodes 111.

As shown in FIG. 3, the scanning line-driving circuit control signal line 105a is disposed at such an area that is above the base-protecting layer 281 and is outside the scanning line driving circuits 105 and 105'. Furthermore, the scanning line-driving circuit power-supply line 105b is disposed at such an area that is on the second interlayer insulating layer 283 and is outside the scanning line-driving circuit control signal line 105a.

As shown in FIG. 4, an inspection-circuit control signal line 106b is disposed at an area that is on the left of the inspection circuit 106 and is above the base-protecting layer 281. Furthermore, an inspection-circuit power-supply line 106c is disposed at an area that is on the left of the inspection-circuit control signal line 106b and is on the second interlayer insulating layer 283.

As shown in FIG. 3, the light-emitting power-supply line 103 is disposed outside the scanning line-driving circuit power-supply line 105b. The light-emitting power-supply line 103 has two lines or a double line structure consisting of conductive parts which are formed on different layers, and is located outside the display pixel portion 3, as described above. The double line structure reduces the wiring resistance.

For example, the red light-emitting power-supply line 103R, which is shown on the left of FIG. 3, includes a first red line 103R1 disposed on the base-protecting layer 281 and a second red line 103R2 disposed above the first red line 103R1 with the second interlayer insulating layer 283 located therebetween. As shown in FIG. 2, the first red line 103R1 and the second red line 103R2 are connected to each other with a contact hole 103R3 extending through the second interlayer insulating layer 283.

As described above, the first red line 103R1 is located at the same hierarchical level as that of the cathode line 12a and the second interlayer insulating layer 283 is located between the first red line 103R1 and the cathode line 12a. In such a configuration, each second capacitor C2 is disposed between the first red line 103R1 and the cathode line 12a.

In the same manner as described above, the green and blue light-emitting power-supply lines 103G and 103B each have a double line structure. They further can include green and first blue lines 103G1 and 103B1, respectively, each disposed on the base-protecting layer 281 and include green and second blue lines 103G2 and 103B2, respectively, each disposed on the second interlayer insulating layer 283. As shown in FIGS. 2 and 3, the first green line 103G1 is connected to the second green line 103G2 with a green contact hole 103G3 extending through the second interlayer insulating layer 283. The first blue line 103B1 is connected to the second blue line 103B2 with a blue contact hole 103B3 extending through the second interlayer insulating layer 283.

Each second capacitor C2 is disposed between the first blue line 103B1 and the cathode line 12a.

The distance between the first red line 103R1 and the second red line 103R2 is preferably, for example, 0.6–1.0 µm. When the distance is less than 0.6 µm, the delay of data signals (image signals) caused by the wiring arises because the parasitic capacitance between source lines and gate lines having different potentials is large in the same manner as for data lines and scanning lines and there are many cross-over sites of the source lines and the gate lines in, for example, each pixel. As a result, the data signals cannot be written in a predetermined period, thereby causing low contrast. The second interlayer insulating layer 283, which is located between the first red line 103R1 and the second red line 103R2, preferably includes $SiO_2$ or the like. However, when an $SiO_2$ layer having a thickness of 1.0 μm or more is formed, there is a risk that the substrate 2 is broken by the stress caused by the $SiO_2$ layer.

The cathode 12 extending from the display pixel portion 3 is disposed above the red light-emitting power-supply lines 103R. In such a structure, the second red line 103R2 of each red light-emitting power-supply line 103R faces the cathode 12 with the first interlayer insulating layer 284 located therebetween, thereby providing each first capacitor C1 between the second red line 103R2 and the cathode 12.

The distance between the second red line 103R2 and the cathode 12 is preferably, for example, 0.6–1.0 μm. When the distance is less than 0.6 μm, a delay due to the wiring arises in data lines using the source lines because parasitic capacitance between pixel electrodes and the source lines having different potentials is large in the same manner as for the data lines and the scanning lines and there are many crossover sites of the source lines and the gate lines in, for example, each pixel. As a result, the data signals (image signals) cannot be written in a predetermined period, thereby causing low contrast. The first interlayer insulating layer 284, which is placed between the second red line 103R2 and the cathode 12, includes preferably $SiO_2$ or an acrylic resin. However, when an $SiO_2$ layer having a thickness of 1.0 μm or more is formed, there is a risk that the substrate 2 is broken by the stress caused by the $SiO_2$ layer. When an acrylic resin is used, an acrylic layer having a thickness of up to about 2.0 μm can be formed. However, there is a risk that pixel electrodes disposed thereon are broken because the acrylic resin swells as it absorbs moisture.

The distance between the first red line 103R1 and the cathode line 12a is preferably 4–200 μm. When the distance is less than 4 μm, there is a risk that a short circuit between the lines occurs depending on the processing accuracy of existing steppers. A material for the second interlayer insulating layer 283, which is located between the second red line 103R2 and the cathode line 12a, preferably includes, for example, $SiO_2$, an acrylic resin, and the like.

As described above, in the display system 1 of this embodiment, the first capacitors C1 are each located between each light-emitting power-supply line 103 and the cathode 12. Therefore, when the potential of a driving current flowing in the light-emitting power-supply lines 103 is lowered, charges accumulated in the first capacitors C1 are supplied to the light-emitting power-supply lines 103, that is, the charges compensate for the shortage of the potential of driving current, to suppress a change in potential. Thus, the display system 1 can normally display images.

In particular, since the light-emitting power-supply lines 103 and the cathode 12 face each other outside the display pixel portion 3, the distance between each light-emitting power-supply line 103 and the cathode 12 can be reduced and a change in the potential of the driving current can be decreased, thereby performing stable image display.

Furthermore, in the display system 1 of this embodiment, the light-emitting power-supply lines 103 each have a double line structure consisting of the first and second lines, and the second capacitors C2 are each disposed between the first line and a cathode line. Therefore, charges accumulated in the second capacitors C2 are also supplied to the light-emitting power-supply lines 103 to reduce a change in the potential, thereby performing stable image display.

Figure 5:
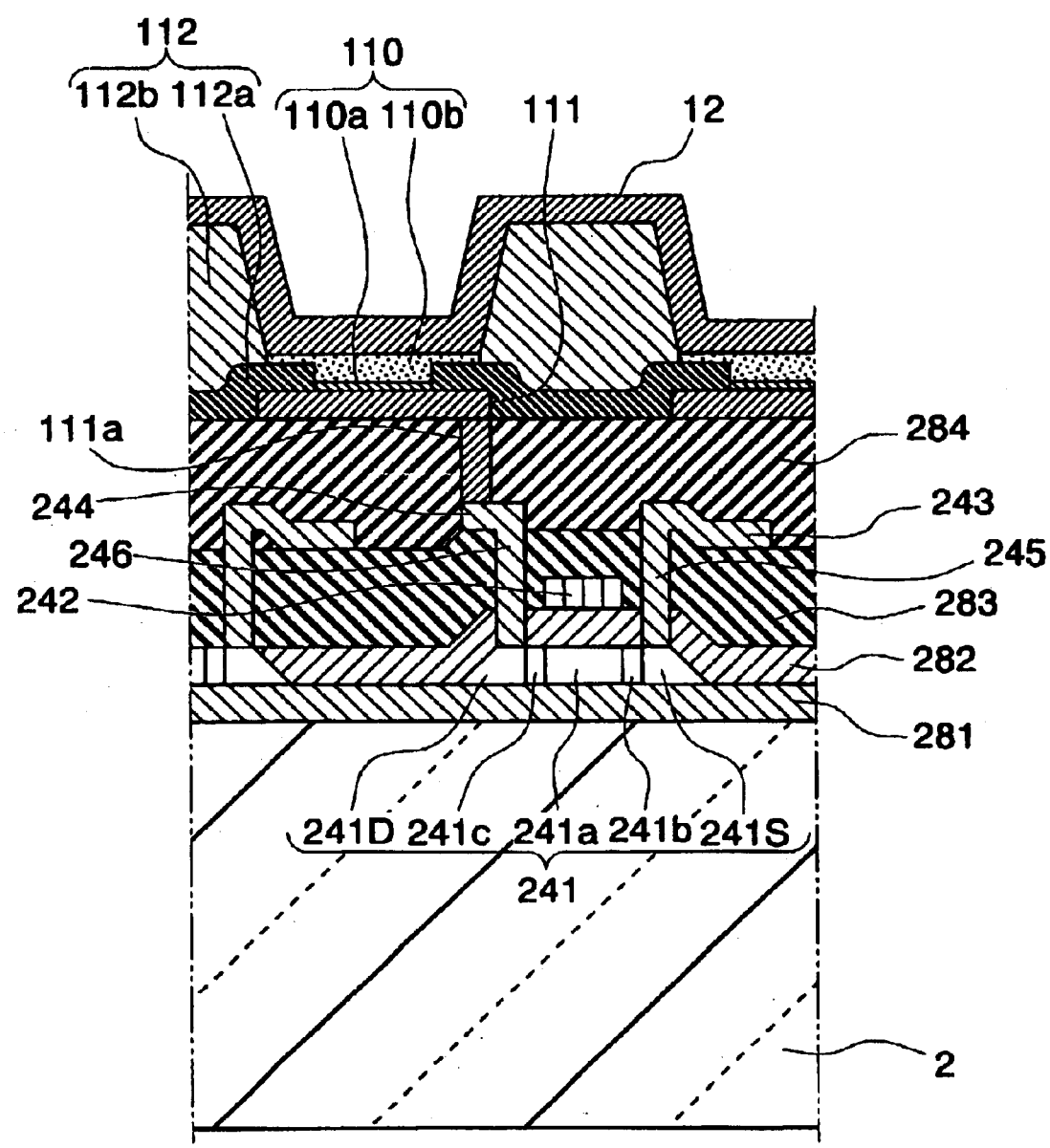
FIG. 5 is a sectional view showing a principle part of the display system of the first embodiment of the present invention.

Next, a configuration of the circuit portion 11 including the current thin-film transistors 123 will now be described in detail. FIG. 5 is a sectional view showing a principle part of the pixel electrode region 11a.

As shown in FIG. 5, the base-protecting layer 281 comprising $SiO_2$ as a main component is disposed on the substrate 2, and first silicon layers 241 having an island shape is disposed on the base-protecting layer 281. The first silicon layers 241 and the base-protecting layer 281 are covered with a gate-insulating layer 282 comprising $SiO_2$ and/or SiN as a main component. Each first gate electrode 242 is disposed above each first silicon layer 241 with the gate-insulating layer 282 located therebetween. The first gate electrode 242 is part of each scanning line.

The first gate electrode 242 and the gate-insulating layer 282 are covered with the second interlayer-insulating layer 283 comprising $SiO_2$ as a main component. The term main component is hereinafter referred to as a component having the maximum content.

In the first silicon layer 241, a region facing the first gate electrode 242 with the gate-insulating layer 282 located therebetween is a channel region 241a. Furthermore, in the first silicon layer 241, a lightly doped source region 241b and a heavily doped source region 241S are located on the right of the channel region 241a, and a lightly doped drain region 241c and a heavily doped drain region 241D are located on the left of the channel region 241a, thereby forming a so-called LDD (Light Doped Drain) structure. The current thin-film transistors 123 each include the first silicon layer 241 as a main portion.

The heavily doped source region 241S is connected to a first source electrode 243 disposed on the second interlayer insulating layer 283 with a first contact hole 245 extending through the gate-insulating layer 282 and the second interlayer insulating layer 283. The first source electrode 243 is part of the above-described data lines. On the other hand, the heavily doped drain region 241D is connected to a first drain electrode 244 comprising the same material as that of the first source electrode 243 with a second contact hole 246 extending through the gate-insulating layer 282 and the second interlayer insulating layer 283.

The first interlayer insulating layer 284 is disposed on the second interlayer insulating layer 283 having the first source electrode 243 and the first drain electrode 244. Each transparent pixel electrode 111 comprising ITO is disposed on the first interlayer insulating layer 284 and is connected to the first drain electrode 244 with a contact hole 111a extending through the first interlayer insulating layer 284. That is, the pixel electrode 111 is connected to the heavily doped drain region 241D of the first silicon layer 241 with the first drain electrode 244.

As shown in FIG. 3, the pixel electrodes 111 are located at an area corresponding to the actual display region 4, and the dummy region 5 located around the actual display region 4 has dummy pixel electrodes 111' having substantially the same configuration as that of the pixel electrodes 111.

The dummy pixel electrodes 111' have substantially the same configuration as that of the pixel electrodes 111 except that each dummy pixel electrode 111' is not connected to the heavily doped drain region 241D.

The actual display region 4 of the display pixel portion 3 has the functional layers 110 and banks 112.

As shown in FIGS. 3 to 5, each functional layer 110 is disposed on each pixel electrode 111. Each bank 112 is disposed between the pixel electrode 111 and the functional layer 110 and partitions the functional layer 110.

The banks 112 each have an inorganic bank layer 112a positioned on the side close to the substrate 2 and an organic bank layer 112b that is positioned on the side far from the substrate 2 and disposed on the inorganic bank layer 112a. A light shielding layer may be disposed between the inorganic bank layer 112a and the organic bank layer 112b.

Part of the inorganic bank layer 112a is disposed on the periphery of each pixel electrode 111 and part of the organic bank layer 112b is disposed above the periphery of the pixel electrode 111. The inorganic bank layer 112a extends closer to the center of the pixel electrode 111 than the organic bank layer 112b.

The inorganic bank layer 112a preferably comprises an inorganic material such as $SiO_2$, $TiO_2$, and SiN. The inorganic bank layer 112a preferably has a thickness of 50–200 nm, and more preferably 150 nm in particular. When the thickness is less than 50 nm, the inorganic bank layer 112a has a thickness smaller than that of a hole injection/transport layer, which is described below. Thus, the hole injection/transport layer cannot maintain the flatness, which is not a preferred situation. When the thickness exceeds 200 nm, the inorganic bank layer 112a has a large step. Thus, a light-emitting layer, which is described below, disposed on the hole injection/transport layer cannot maintain the flatness, which is not a preferred situation.

The organic bank layer 112b comprises an ordinary resist material such as an acrylic resin and a polyimide resin. The organic bank layer 112b preferably has a thickness of 0.1–3.5 µm, and more preferably about 2 µm in particular. When the thickness is less than 0.1 µm, the organic bank layer 112b has a thickness smaller than the total thickness of the hole injection/transport and light-emitting layers, which are described below. Thus, that there is a risk that the light-emitting layer extends over an upper opening 112d, which is not a preferred situation. When the thickness exceeds 3.5 µm, the upper opening 112d has a large step. Thus, the step coverage of the cathode 12 disposed on the organic bank layer 112b cannot be obtained, which is not a preferred situation. It is preferable that the organic bank layer 112b has a thickness of 2 µm or more because the cathode 12 is securely insulated from the pixel electrodes 111.

As described above, the functional layer 110 has a thickness smaller than that of the bank 112.

A hydrophilic region and a hydrophobic region are arranged around the bank 112.

The hydrophilic region includes the inorganic bank layers 112a and the pixel electrodes 111, which have a hydrophilic group such as a hydroxyl group, formed by plasma treating using oxygen as a reaction gas. The hydrophobic region includes the organic bank layers 112b, which have a hydrophobic group such as fluorine, formed by plasma treating using carbon tetrafluoride as a reaction gas.

As shown in FIG. 5, each functional layer 110 includes a hole injection/transport layer 110a disposed on each pixel electrode 111 and a light-emitting layer 110b on the hole injection/transport layer 110a.

The hole injection/transport layer 110a has a function of injecting holes into the light-emitting layer 110b and a function of transporting holes in itself. Since the hole injection/transport layer 110a is disposed between the pixel electrode 111 and the light-emitting layer 110b, the light-emitting layer 110b is improved in display element characteristics such as light-emitting efficiency and life. In the light-emitting layer 110b, holes injected from the hole injection/transport layer 110a and electrons supplied from the cathode 12 are coupled to emit light.

The light-emitting layer 110b has three layers consisting of a red light-emitting layer displaying red (R), a green light-emitting layer displaying green (G), and a blue light-emitting layer displaying blue (B), which are arranged in a stripe pattern, as shown in FIGS. 1 and 2.

As shown in FIG. 4, the dummy region 5 of the display pixel portion 3 has dummy functional layers 210 and dummy banks 212.

The dummy banks 212 each include a dummy inorganic bank layer 212a located at the position close to the substrate 2 and a dummy organic bank layer 212b located at the position far from the substrate 2. The dummy inorganic bank layer 212a is disposed over each entire dummy pixel electrode 111'. The dummy organic bank layer 212b is disposed between the pixel electrodes 111 in the same way as for the organic bank layer 112b.

The dummy functional layers 210 are each disposed above each dummy pixel electrode 111' with the dummy inorganic bank layer 212a located therebetween.

The dummy inorganic bank layer 212a and the dummy organic bank layer 212b comprise the same material and have the same thickness as those of the inorganic bank layer 112a and the organic bank layer 112b, respectively.

The dummy functional layers 210 each include a dummy hole injection/transport layer and a dummy light-emitting layer, which are stacked and are not shown. The dummy hole injection/transport layer and the dummy light-emitting layer comprise the same material and have the same thickness as those of the hole injection/transport layer 110a and the light-emitting layer 110b, respectively.

Thus, the dummy functional layers 210 have a thickness smaller than that of the dummy banks 212 in the same manner as for the above-mentioned functional layers 110.

Since the dummy region 5 is arranged around the actual display region 4, the functional layers 110 of the actual display region 4 have a uniform thickness, thereby suppressing the uneven display. That is, since the dummy region 5 is used, a discharged composition can be dried under an even condition in the actual display region 4 when display elements are prepared by an ink jet method. Therefore, there is no risk that the functional layers 110 have an uneven thickness at the periphery near the actual display region 4.

The cathode 12 is disposed over the actual display region 4 and the dummy region 5 and extends to the substrate 2 exposed outside the dummy region 5 to face the light-emitting power-supply lines 103 outside the dummy region 5, that is, outside the display pixel portion 3.

The ends of the cathode 12 are connected to the cathode lines 12a of the circuit portion 11.

The cathode 12 functions as the counter electrode of the pixel electrodes 111 to supply electrons to the functional layers 110. The cathode 12 can include a first cathode layer 12b having a layered body and a second cathode layer 12c, which are stacked, wherein the layered body comprises, for example, lithium fluoride and calcium. In the cathode 12, only the second cathode layer 12c extends outside the display pixel portion 3.

The second cathode layer 12c has a function of reflecting light emitted from the light-emitting layer 110b in the direction of the substrate 2 and preferably comprises, for example, Al or Ag, or includes an Mg/Ag layered body.

A protective layer, comprising $SiO_2$, SiN, or the like, for preventing oxidation may be disposed on the first cathode layer 12b.

Next, a method for manufacturing a display system of this embodiment will now be described with reference to the accompanying drawings. With reference to FIGS. 6 to 8, a method for manufacturing the circuit portion 11 on the substrate 2 is illustrated. FIGS. 6 to 8 are sectional views corresponding to the cross section taken along the line A–A' of FIG. 2. In the following description, impurity concentration after activation-annealing treatment is used.

Figure 6A:
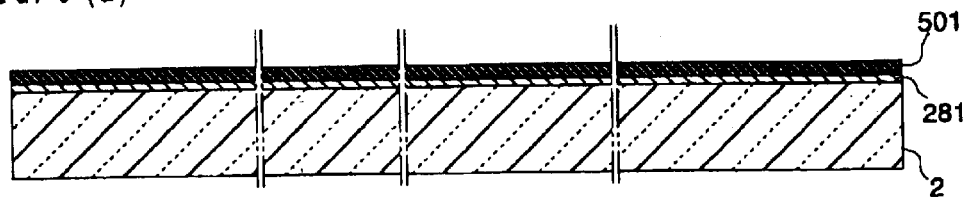
FIG. 6 is a view illustrating successive steps of a process for manufacturing the display system of the first embodiment of the present invention.

As shown in FIG. 6(a), the base-protecting layer 281 including silicon oxide is formed on the substrate 2. An amorphous silicon layer is then provided thereon using an ICVD method, a plasma CVD method, or the like to make the crystal grains grow by a laser annealing method or a rapid heating method to form a polysilicon layer 501.

Figure 6B:
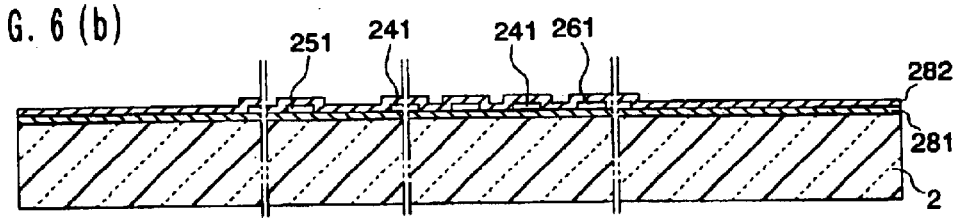

As shown in FIG. 6(b), the polysilicon layer 501 is then patterned to form the first silicon layers 241 and second and third silicon layers 251 and 261 having an island shape by a photolithography method, and the gate-insulating layer 282 comprising silicon oxide is further formed.

The first silicon layers 241 are included in the current thin-film transistors 123 (herein referred to as "pixel TFTs" in some cases) that are formed at an area corresponding to the actual display region 4 and are connected to the corresponding pixel electrodes 111. The second and third silicon layers 251 and 261 are included in P channel-type and N channel-type thin-film transistors (hereinafter referred to as driving circuit TFTs in some cases) in the scanning line driving circuits 105 and 105'.

The gate-insulating layer 282 comprising silicon oxide is formed by a plasma CVD method or a thermal oxidation method so as to cover the first, second, and third silicon layers 241, 251, and 261 and the base-protecting layer 281 and so as to have a thickness of 30–200 nm. When the gate-insulating layer 282 is formed by a thermal oxidation method, the first, second, and third silicon layers 241, 251, and 261 are crystallized, thereby transforming these silicon layers into polysilicon layers. In order to perform channel doping, for example, boron ions are implanted at a dosage of about $1 \times 10^{12}$ cm$^{-2}$ in the above step. As a result, the first, second, and third silicon layers 241, 251, and 261 are transformed into lightly doped P-type silicon layers having an impurity concentration of about $1 \times 10^{17}$ cm$^{-3}$.

Figure 6C:
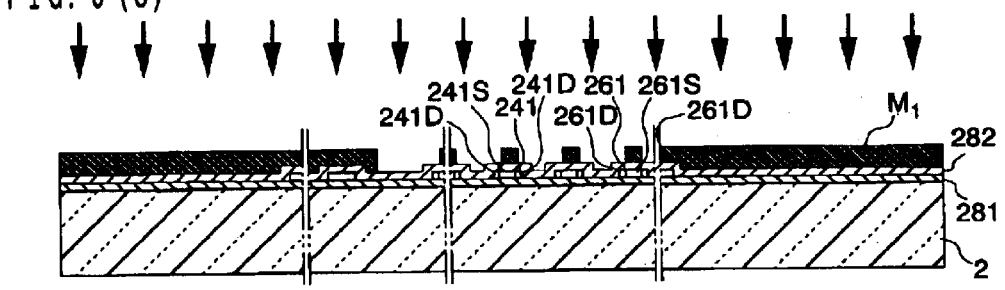

As shown in FIG. 6(c), a first ion-implanting selection mask M1 is formed so as to partly cover the first and third silicon layers 241 and 261 to implant phosphorus ions into uncovered regions at a dosage of about $1 \times 10^{15}$ cm$^{-2}$. As a result, the impurity ions are heavily implanted in a self-aligned manner with respect to the first ion-implanting selection mask M1 to form a first heavily doped source region 241S and a first heavily doped drain region 241D in each first silicon layer 241 and to form a third heavily doped source region 261S and a third heavily doped drain region 261D in each third silicon layer 261.

Figure 6D:
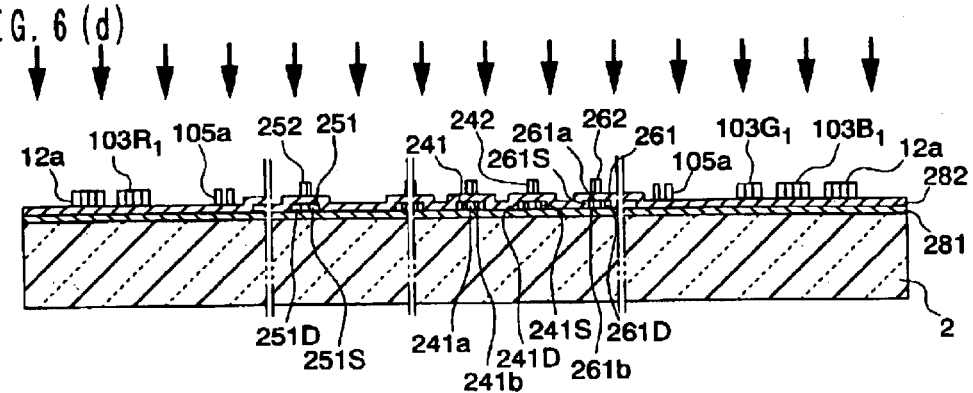

As shown in FIG. 6(d), after the first ion-implanting selection mask M1 is removed, a doped silicon layer, a silicide layer, or a metal layer such as an aluminum layer, a chromium layer, or a tantalum layer are formed on the gate-insulating layer 282 so as to have a thickness of about 500 nm. The metal layer is then patterned to form second gate electrodes 252 for the P channel-type driving circuit TFTs, first gate electrodes 242 for the pixel TFTs, and third gate electrodes 262 for N channel-type driving circuit TFTs. Parts of the scanning line-driving circuit control signal lines 105a, the red, green, and first blue lines 103R1, 103G1, and 103B1, and the cathode lines 12a are formed by the above patterning in the same step.

Phosphorus ions are implanted into the first, second, and third silicon layers 241, 251, and 261 at a dosage of about $4 \times 10^{13}$ cm$^{-2}$ using the first, second, and third gate electrodes 242, 252, and 262, respectively, as masks. As a result, as shown in FIG. 6(d), the impurity ions are heavily implanted in a self-aligned manner with respect to the first, second, and third gate electrodes 242, 252, and 262 to form the first lightly doped source region 241b and the first lightly doped drain region 241c in each first silicon layer 241 and to form a third lightly doped source region 261b and a third lightly doped drain region 126c in each third silicon layer 261. Furthermore, a second lightly doped source region 251S and a second lightly doped drain region 251D are formed in each second silicon layer 251.

Figure 7A:
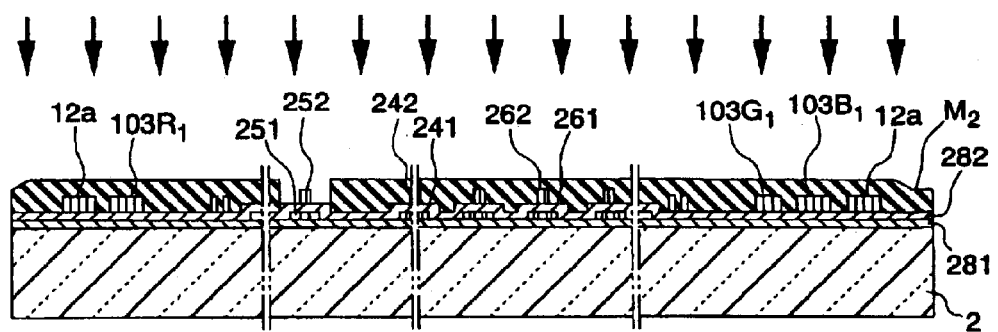
FIG. 7 is a view illustrating successive steps of a process for manufacturing the display system of the first embodiment of the present invention.

As shown in FIG. 7(a), a second ion-implanting selection mask M2 is formed on an entire surface of the above configuration except for the periphery of each second gate electrode 252. Boron ions are implanted into the second silicon layer 251 at a dosage of about $1.5 \times 10^{15}$ cm$^{-2}$ using the second ion-implanting selection mask M2. In this step, the second gate electrode 252 also functions as a mask and the impurity ions are heavily implanted into the second silicon layer 251 in a self-aligned manner. Therefore, the second lightly doped source region 251S and the second lightly doped drain region 251D are counter-doped to be a source region and a drain region, respectively, of each P channel-type driving circuit TFT.

Figure 7B:
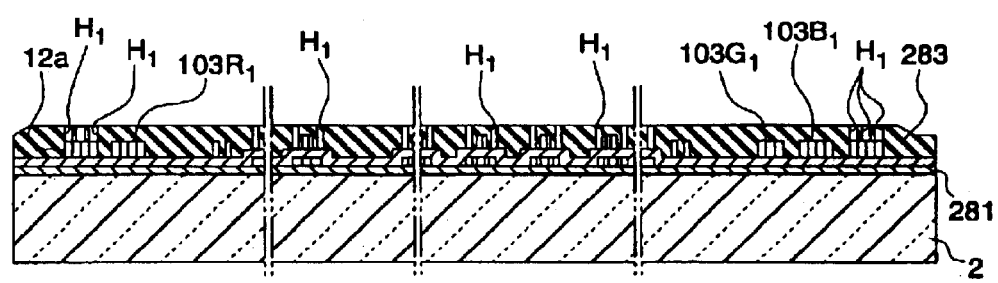

As shown in FIG. 7(b), after the second ion-implanting selection mask M2 is removed, the second interlayer insulating layer 283 is formed over the substrate 2 to pattern the second interlayer insulating layer 283 by a photolithography method to form first holes H1 for forming contact holes at positions corresponding to the source electrode and the drain electrode of each TFT and the cathode line 12a.

Figure 7C:
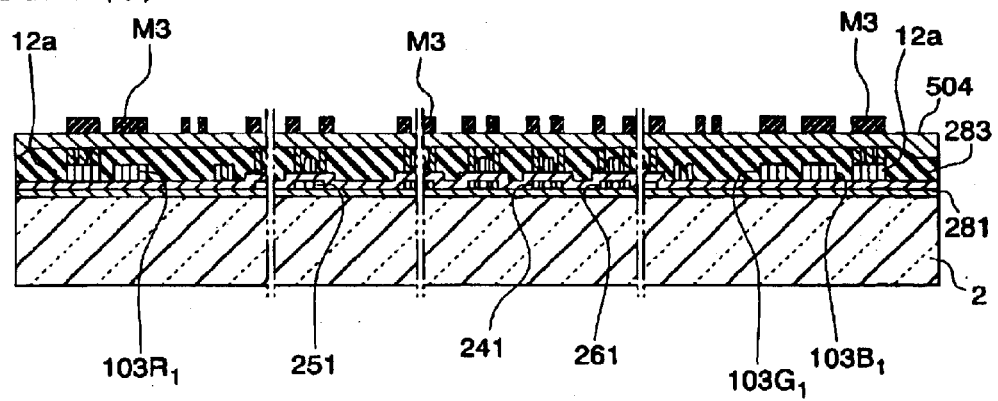

As shown in FIG. 7(c), a conductive layer 504 including aluminum, chromium, or tantalum and having a thickness of about 20–800 nm is formed so as to cover the second interlayer insulating layer 283 and so as to pack such a metal into the first holes H1 to form the contact holes. Furthermore, a patterning mask M3 is formed on the conductive layer 504.

Figure 8A:
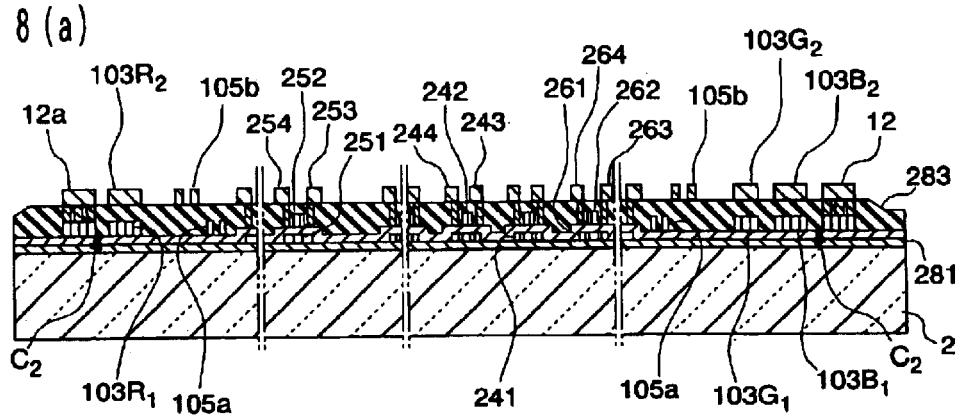
FIG. 8 is a view illustrating successive steps of a process for manufacturing the display system of the first embodiment of the present invention.

As shown in FIG. 8(a), the conductive layer 504 is patterned using the patterning mask M3 to form the first, second, and third source electrodes 243, 253 and 263, and the first and second drain electrodes 244 and 254 of each TFT, the red, green, and second blue line 103R2, 103G2, and 103B2 of each light-emitting power-supply line, the scanning line-driving circuit power-supply lines 105b, and the cathode line 12a.

As described above, the red and first blue lines 103R1 103B1 are arranged with a certain distance located therebetween at the same hierarchical level as that of the cathode line 12a to form each second capacitor C2.

Figure 8B:
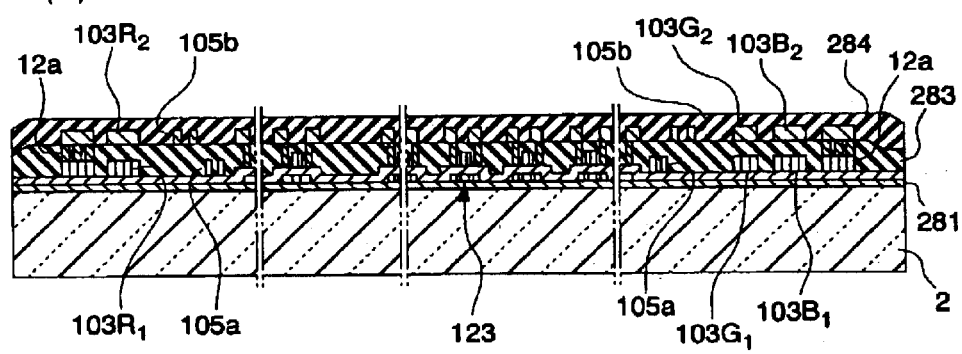

As shown in FIG. 8(b), the first interlayer insulating layer 284 comprising, for example, a resin material such as an acrylic resin is formed so as to cover the second interlayer insulating layer 283. The first interlayer insulating layer 284 preferably has a thickness of about 1–2 µm.

Figure 8C:
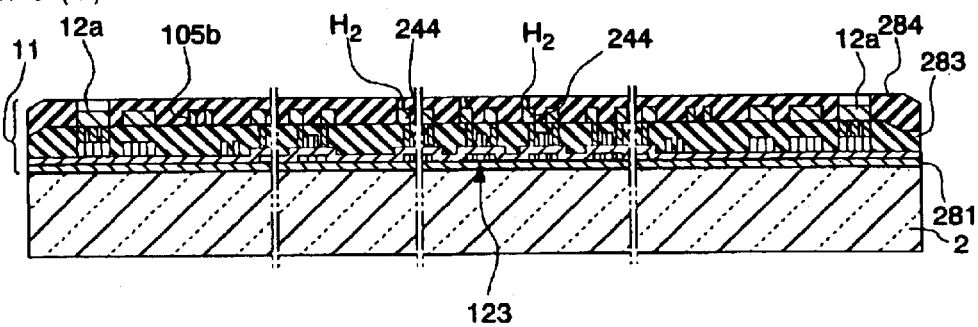

As shown in FIG. 8(c), a portion of the first interlayer insulating layer 284 corresponding to the first drain electrode 244 of each pixel TFT is etched to form each first hole H1 for forming contact holes. In this step, a portion of the first interlayer insulating layer 284 on each cathode line 12a is also removed. According to the above procedure, the circuit portion 11 is completed on the substrate 2.

Next, with reference to FIG. 9, a procedure of obtaining the display system 1 by forming the display pixel portion 3 on the circuit portion 11 will now be described. FIG. 9 shows sectional views corresponding to the cross-sections taken along the line A–A' of FIG. 2.

Figure 9A:
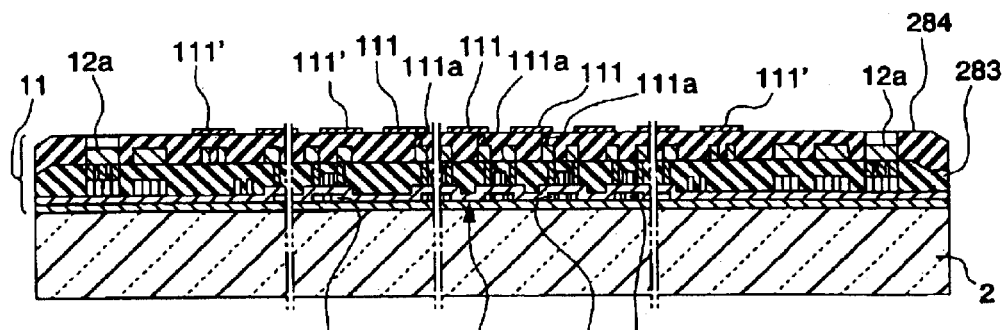
FIG. 9 is a view illustrating successive steps of a process for manufacturing the display system of the first embodiment of the present invention.

As shown in FIG. 9(a), a thin film comprising a transparent electrode material such as ITO is formed so as to cover the substrate 2, and the thin film is then patterned such that second holes H2 disposed in the first interlayer insulating layer 284 is filled to form contact holes 111a, and the pixel electrodes 111 and the dummy pixel electrodes 111' are formed. The pixel electrodes 111 are formed only at positions for forming the current thin-film transistors 123 (switching elements) and connected to the current thin-film transistors 123 with the contact holes 111a. The dummy pixel electrodes 111' are arranged in a dotted pattern.

Figure 9B:
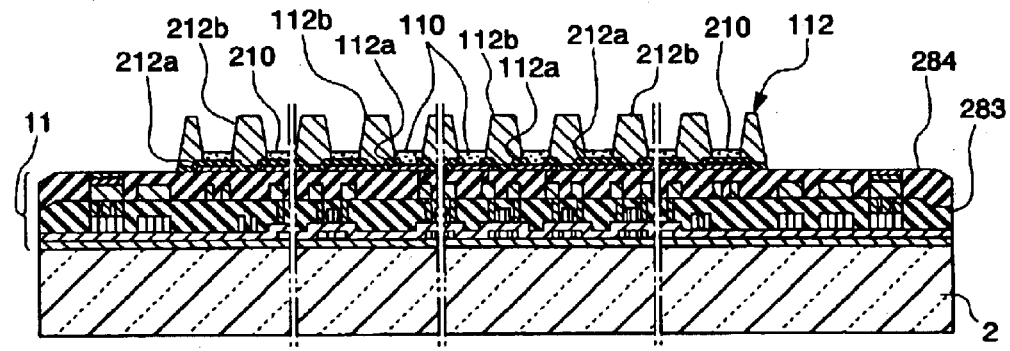

As shown in FIG. 9(b), the inorganic bank layers 112a and the dummy inorganic bank layers 212a are formed on the first interlayer insulating layer 284, the pixel electrodes 111, and the dummy pixel electrodes 111'. The inorganic bank layers 112a are formed so as to make part of each pixel electrode 111 to be exposed, and the dummy inorganic bank layers 212a are formed so as to entirely cover the dummy pixel electrodes 111'.

The inorganic bank layers 112a and the dummy inorganic bank layers 212a are formed by the following procedure. An organic layer including $SiO_2$, $TiO_2$, SiN, or the like is formed over the first interlayer insulating layer 284 and the pixel electrodes 111 by, for example, a CVD method, a TEOS method, a sputtering method, or a vapor deposition method to pattern the organic layer.

As shown in FIG. 9(b), the organic bank layers 112b are each formed on the corresponding inorganic bank layers 112a, and the dummy organic bank layers 212b are each formed on the corresponding dummy inorganic bank layers 212a. The organic bank layers 112b are arranged so as to make part of each pixel electrode 111 be exposed through each inorganic bank layer 112a, and the dummy organic bank layers 212b are arranged so as to make part of each dummy inorganic bank layer 212a be exposed. According to the above procedure, the banks 112 are completed on the first interlayer insulating layer 284.

Subsequently, a hydrophilic region and a hydrophobic region are formed on each bank 112. In this embodiment, each region is formed in a plasma-treating step. The plasma-treating step includes at least a hydrophilic property-providing sub-step of providing hydrophilic properties to the pixel electrodes 111, the inorganic bank layers 112a, and the dummy inorganic bank layers 212a and a hydrophobic property-providing sub-step of providing hydrophobic properties to the organic bank layers 112b and the dummy organic bank layers 212b.

In other words, the banks 112 are heated to a predetermined temperature (for example, about 70–80° C.) to perform a plasma treatment ($O_2$ plasma treatment) using oxygen as a reactant gas in the atmosphere in the hydrophilic property-providing sub-step. Subsequently, another plasma treatment ($CF_4$ plasma treatment) using carbon tetrachloride as a reactant gas is performed in the atmosphere in the hydrophobic property-providing sub-step, and the banks 112 heated for performing the plasma treatments are then cooled to room temperature to provide hydrophilic properties and hydrophobic properties to predetermined regions.

Furthermore, the functional layers 110 are each formed on the corresponding pixel electrodes 111 and the dummy functional layers 210 are each formed on the corresponding dummy inorganic bank layers 212a by an ink jet method. That is, the functional layers 110 and the dummy functional layers 210 are formed according to the following procedure. An ink composition containing materials for hole injection/transport layers is discharged onto the pixel electrodes 111 and the dummy inorganic bank layers 212a, the applied ink composition is then dried, another ink composition containing materials for light-emitting layers is further discharged thereon, and the applied ink composition is then dried. Steps after this step of forming the functional layers 110 and the dummy functional layers 210 are preferably conducted in an inert gas atmosphere such as a nitrogen atmosphere or an argon atmosphere in order to prevent the oxidation of the hole injection/transport layers and the light-emitting layers.

Figure 9C:
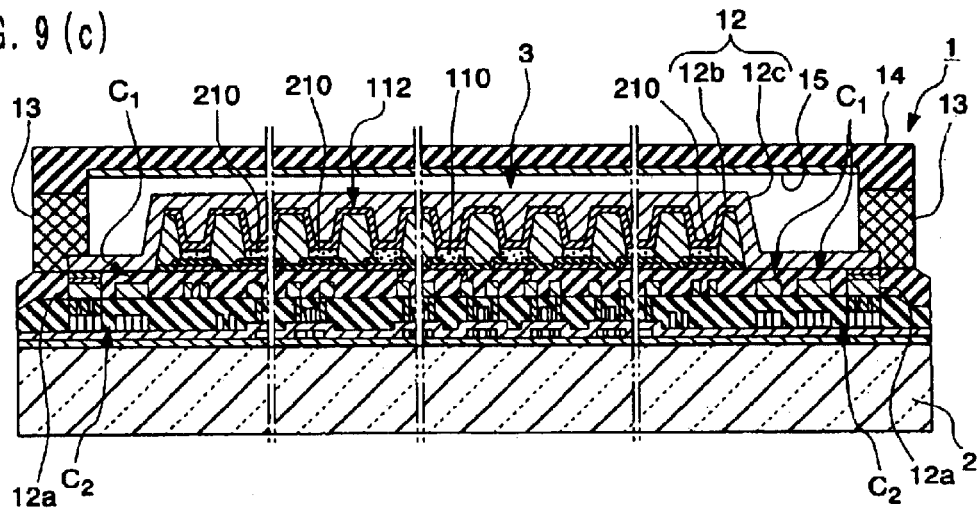

As shown in FIG. 9(c), the cathode 12 covering the banks 112, the functional layers 110, and the dummy functional layers 210 is formed. The cathode 12 is obtained according to the following procedure. The first cathode layer 12b is formed over the banks 112, the functional layers 110, and the dummy functional layers 210, and the second cathode layer 12c that covers the first cathode layer 12b and is connected to the cathode line 12a on the substrate 2 is then formed.

In such a configuration, since the second cathode layer 12c extends from the display pixel portion 3 to portions above the periphery of the substrate 2, the second cathode layer 12c faces light-emitting power-supply lines 103 with the first interlayer insulating layer 284 located therebetween. Thus, the first capacitors C1 are each disposed between the second cathode layer 12c (cathode) and each light-emitting power-supply line 103.

Finally, the sealing material 13 including an epoxy resin or the like is applied onto the substrate 2 to join the substrate 2 together with the sealing substrate 14 with sealing material 13 located therebetween. According to the above procedure, the display system 1 can be obtained, as shown in FIGS. 1 to 4.

A second embodiment of the present invention will now be described with reference to the accompanying drawings. This is one of the embodiments of the present invention, and the present invention is not limited to this embodiment. Within the scope of the present invention, various changes may be performed. In the following drawings, in order to show each layer and member in the drawings on a recognizable scale, different scales are used for showing the layers and members.

Figure 10:
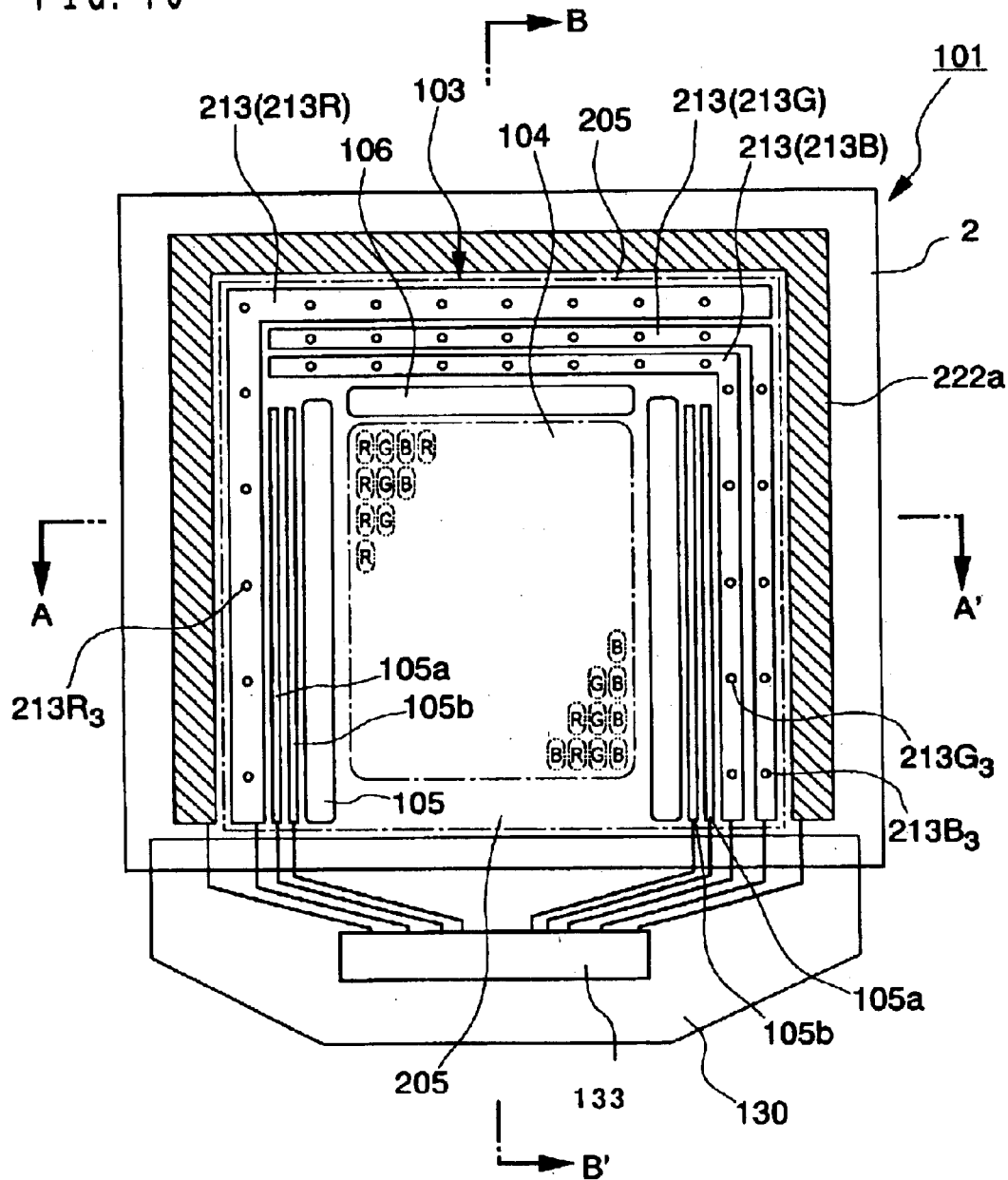
FIG. 10 is a schematic plan view showing a display system of a second embodiment of the present invention.
Figure 11:
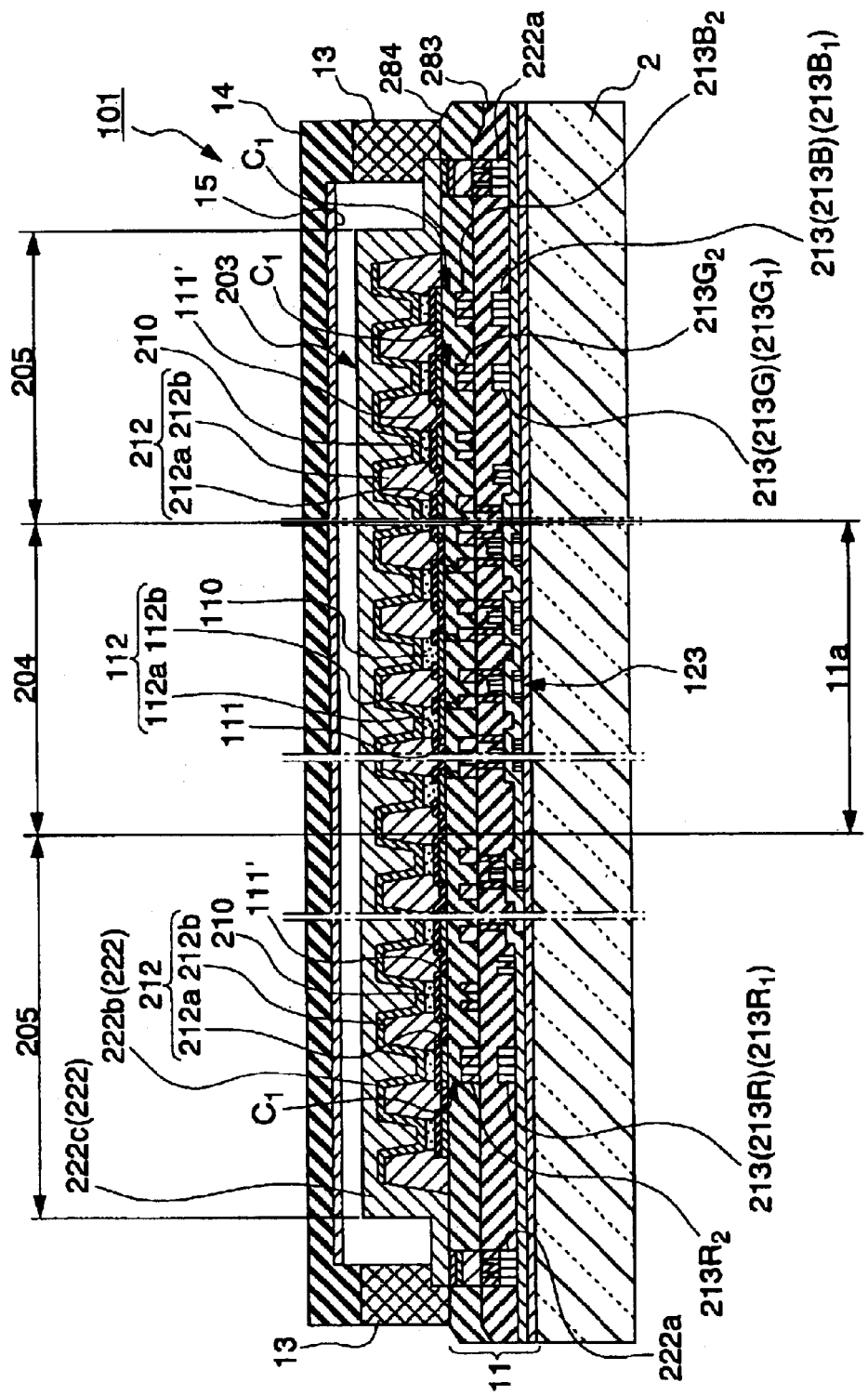
FIG. 11 is a sectional view taken along the line A–A' of FIG. 10.

FIGS. 10 and 11 show an example of a display system 101 of this embodiment. FIG. 10 is a schematic plan view showing the display system 101 of this embodiment, and FIG. 11 is a sectional view taken along the line A—A' of FIG. 10. Among components shown in FIGS. 10 and 11, the same components as those shown in FIGS. 2 and 3 illustrated above have the same reference numerals in order to omit or simplify the description.

As shown in FIG. 10, the display system 101 of this embodiment includes a substrate 2, a pixel electrode region (first electrode region), which is not shown, having a plurality of pixel electrodes (first electrodes) arranged in a matrix on the substrate 2, light-emitting power-supply lines 213 (213R, 213G, and 213B) arranged around the pixel electrode region, and a display pixel portion 203 (the area surrounded by the one-dot chain line in the figure) that is located at least above the pixel electrode region and has a substantially rectangular shape when viewed from above. The display pixel portion 203 is partitioned into an actual display region 204 (the area surrounded by the two-dot chain line in the figure) located at the center area and a dummy region 205 (the area between the one-dot chain line and the two-dot chain line in the figure) located around the actual display region 204.

Scanning line driving circuits 105 and 105' are disposed at areas that are on both the sides of the actual display region 204 and are on the back (the side close to the substrate 2) of the dummy region 205. Furthermore, scanning line driving circuit control signal lines 105a and scanning line driving circuit power-supply lines 105b that are connected to the scanning line driving circuits 105 and 105' are arranged at the lower portions of the dummy region 205.

An inspection circuit 106 is placed at an area that is above the actual display region 204 and is on the back (the side close to the substrate 2) of the dummy region 205.

The light-emitting power-supply lines 213 (213R, 213G, and 213B) are also arranged on the back of the dummy region 205. The light-emitting power-supply lines 213 (213R, 213G, and 213B) extend upward from the lower area of the substrate 2 along the scanning line-driving circuit power-supply lines 105b, bend at the positions that the scanning line driving circuit power-supply lines 105b are terminated, and are connected to pixel electrodes, which are not shown, located in the actual display region 204.

As described above, in this embodiment, the dummy region 205 extends over the light-emitting power-supply lines 213, which is different from the configuration of the first embodiment.

As shown in FIG. 11, a circuit portion 11 is disposed on the substrate 2, and a display pixel portion 203 is disposed on the circuit portion 11. The substrate 2 has sealing material 13, and the display pixel portion 203 has a sealing substrate 14 thereon.

A pixel electrode region 11a is located at the center area of the circuit portion 11. The pixel electrode region 11a includes current thin-film transistors 123 (switching elements) and pixel electrodes 111 connected to the corresponding current thin-film transistors 123.

Dummy pixel electrodes 111' are arranged around the pixel electrode region 11a.

In FIG. 11, the scanning line driving circuits 105 and 105' are arranged on both the sides of the pixel electrode region 11a.

The scanning line driving circuits 105 and 105' each have a thin-film transistor 105c, which is an N or P channel type, that is a component of an inverter included in a shift register.

The scanning line driving circuit control signal lines 105a are disposed on a base-protecting layer 281 located outside the scanning line driving circuits 105 and 105'. The scanning line driving circuit power-supply lines 105b are disposed on a second interlayer insulating layer 283.

A cathode (second electrode) 222 is disposed over the actual display region 204 and the dummy region 205, both the ends of the cathode 222 extend to the periphery of the substrate 2, which is located outside the dummy region 205, and the ends of the cathode 222 are connected to cathode lines (second electrode lines) 222a disposed in the circuit portion 11.

The cathode 222 functions as a counter electrode of each pixel electrode 111 to supply a current to each functional layer 110. The cathode 222 includes, for example, a first cathode layer 222b and a second cathode layer 222c, which are stacked. In the cathode 222, only the second cathode layer 222c extends outside the display pixel portion 3.

The first and second cathode layers 222b and 222c can include the same material and have the same thickness as those of the first and second cathode layer 12b and 12c, respectively, as described above.

The light-emitting power-supply lines 213 are arranged outside the scanning line driving circuit power-supply lines 105b. The light-emitting power-supply lines 213 are disposed below the dummy region 205, as described above.

The dummy region 205 includes dummy functional layers 210 and dummy banks 212, wherein the dummy functional layers 210 each disposed above each dummy pixel electrode 111' with a dummy inorganic bank layer 212a located therebetween, and the dummy banks 212 are each located between the dummy functional layers 210. The dummy functional layers 210 have a thickness smaller than that of the dummy banks 212. Light-emitting power-supply lines 103 each face the cathode 222 with each dummy functional layer 210 located therebetween. That is; each light-emitting power-supply line 103 is located at a position corresponding to a portion between the dummy banks 212.

In addition to each pixel electrode 111 and each dummy functional layer 210, part of the cathode 222 is disposed between the dummy banks 212. Thus, the cathode 222 and each light-emitting power-supply line 103 face each other with each first interlayer insulating layer 284, each pixel electrode 111, each dummy inorganic bank layer 212a, and each dummy functional layer 210 located therebetween.

Since the dummy functional layers 210 have a thickness smaller than that of the dummy banks 212, part of the cathode 222 on each dummy functional layer 210 is closer to each light-emitting power-supply line 213 than another part of the cathode 222 on each dummy bank 212.

As described above, the cathode 222 and each light-emitting power-supply line 103 face each other with each dummy functional layer 210 located therebetween to form each first capacitor C1.

When the light-emitting power-supply lines 103 are placed so as to face the dummy banks 212, the cathode 222 and each light-emitting power-supply line 103 face each other with each dummy bank 212 located therebetween. In such a configuration, the distance between the cathode 222 and each light-emitting power-supply line 103 is too large to form a capacitor, which is not preferable.

The light-emitting power-supply lines 213 each have a double line structure consisting of two lines.

That is, for example, each red light-emitting power-supply line 213R located in the left area in FIG. 11 includes each first red line 213R1 disposed on the base-protecting layer 281 and each second red line 213R2 disposed on the second interlayer insulating layer 283. The first red line 213R1 is connected to the second red line 213R2 with each red contact hole 213R3 extending through the second interlayer insulating layer 283, as shown in FIG. 10.

As described above, each first red line 213R1 is located at the same hierarchical level as that of the cathode lines 222a, and the second interlayer insulating layer 283 is located between the first red lines 213R1 and the cathode lines 222a. In such a configuration, each first red line 213R1 and each cathode line 222a have each second capacitor C2 therebetween.

In the same manner as described above, green and blue light-emitting power-supply lines 213G and 213B, respectively, located in the right area in FIG. 11 also have a double line structure. Each green light-emitting power-supply line 213G has each first green line 213G1 disposed on the base-protecting layer 281 and each second green line 213G2 disposed on the second interlayer insulating layer 283, and each blue light-emitting power-supply line 213B has each first blue line 213B1 disposed on the base-protecting layer 281 and each second blue line 213B2 disposed on the second interlayer insulating layer 283. As shown in FIGS. 2 and 3, the first green line 213G1 is connected to the second green line 213G2 with each green contact hole 213G3 extending through the second interlayer insulating layer 283, and the first blue line 213B1 is connected to the second blue line 213B2 with each blue contact hole 213B3 extending through the second interlayer insulating layer 283.

Each first blue line 213B1 and each cathode line 222a have each second capacitor C2 therebetween.

The distance between each second red line 213R2 and the cathode 222 is preferably, for example, 0.6–1.0 μm. When the distance is less than 0.6 μm, the delay of data signals caused by the wiring arises in data lines using source lines because the parasitic capacitance between the source lines and gate electrodes having different potentials is large. Therefore, data signals (image signals) cannot be written in a predetermined period, thereby causing low contrast. The first interlayer insulating layer 284, which is located between the second red line 213R2 and the cathode 222, preferably comprises $SiO_2$ or the like. However, when an $SiO_2$ layer having a thickness of 1.0 μm or more is formed, there is a risk that the substrate 2 is broken by the stress caused by the $SiO_2$ layer. When an acrylic resin is used, an acrylic layer having a thickness of up to about 2.0 μm can be formed. However, there is a risk that pixel electrodes disposed thereon are broken because the acrylic resin swells as it absorbs moisture.

The distance between the first red line 213R1 and the cathode line 222a is preferably 4–200 μm. When the distance is less than 4 μm, there is a risk that a short circuit between the lines occurs depending on the processing accuracy of existing steppers. A material for the second interlayer insulating layer 283, which is located between the second red line 213R2 and the cathode line 222a, preferably includes, for example, $SiO_2$, an acrylic resin, and the like.

As described above, according to the display system 101 of this embodiment, the following advantages can be obtained in addition to the same advantages as those of the display system 1 of the first embodiment.

In the display system 101 of this embodiment, since the dummy region 205 surrounds the actual display region 204 and the light-emitting power-supply lines 213 each face the cathode 222, the light-emitting power-supply lines 213 are located under the dummy region 205. Therefore, there is no need to additionally provide an area for arranging the light-emitting power-supply lines 213 outside the light-emitting element region, thereby relatively expanding the area of the actual display region 204.

Particular examples of electronic devices including any one of display systems of the first and second embodiments will now be described.

Figure 12A:
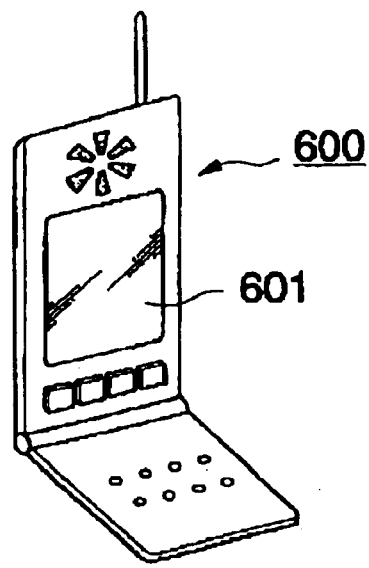
FIG. 12 is a perspective view showing an electronic device of a third embodiment of the present invention.

FIG. 12(a) is a perspective view showing an exemplary mobile phone. In FIG. 12(a), reference numeral 600 represents the whole mobile phone and reference numeral 601 represents a display portion including one of the display systems 1 and 101.

Figure 12B:
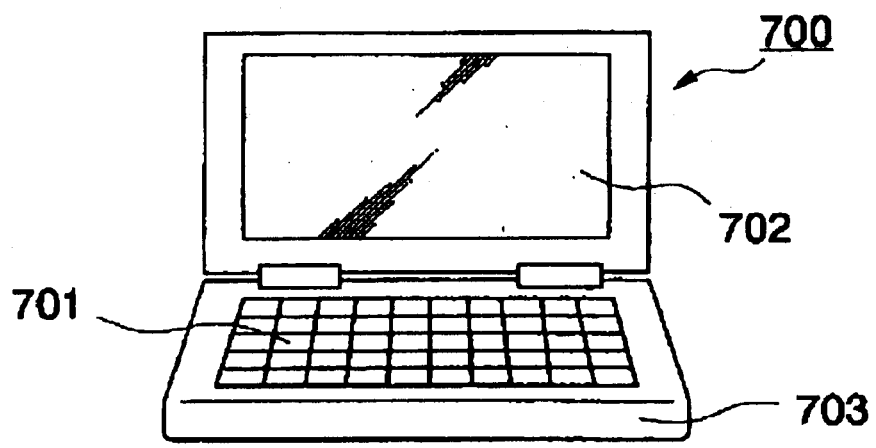

FIG. 12(b) is a perspective view showing exemplary mobile information processing equipment such as a word processor and a personal computer. In FIG. 12(b), reference numeral 700 represents information processing equipment, reference numeral 701 represents an input portion such as a key board, reference numeral 703 represents an information processing unit, and reference numeral 702 represents a display portion including one of the display systems 1 and 101.

Figure 12C:
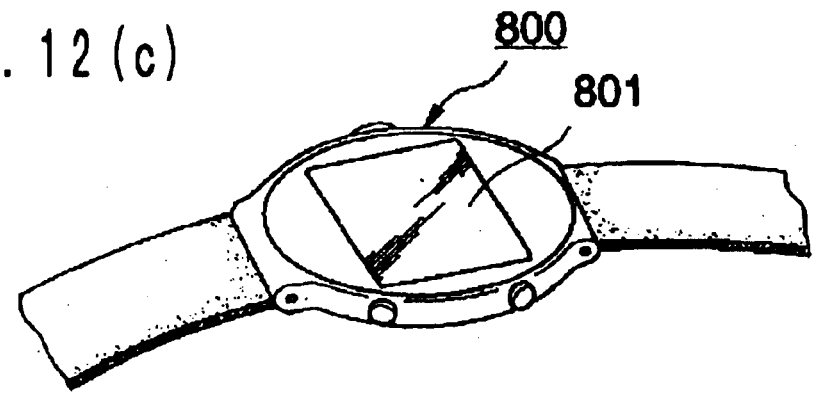
Figure 13:
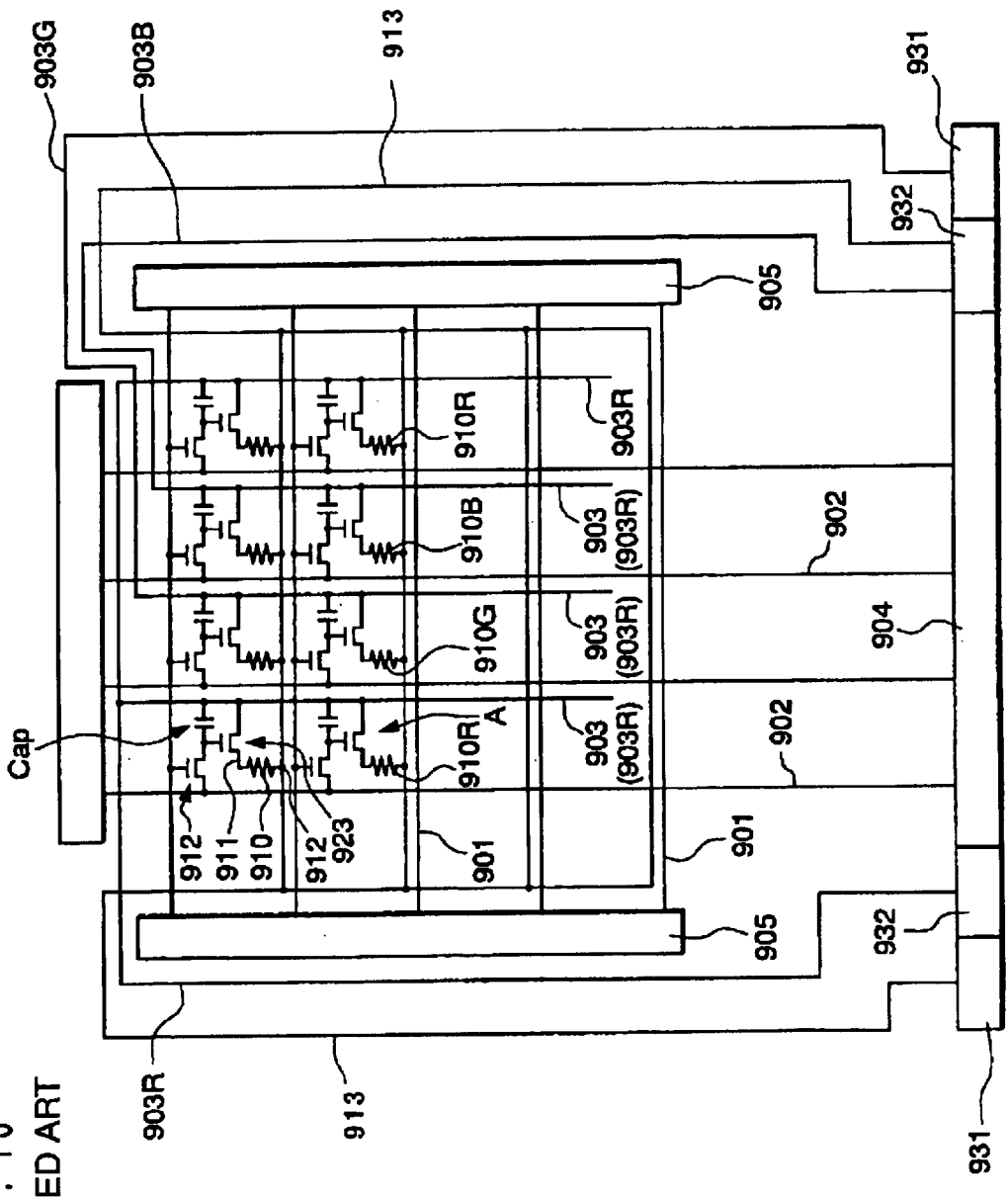
FIG. 13 is a schematic plan view showing a wiring structure of a conventional display system.

FIG. 12(c) is a perspective view showing an exemplary wristwatch-type electronic device. In FIG. 12(c), reference numeral 800 represents a wristwatch main body and reference numeral 801 represents a display portion including one of the display systems 1 and 101.

The electronic devices shown in FIGS. 12(a) to 12(c) are equipped with one of the display systems 1 and 101, and therefore have the advantages of the display system of the first or second embodiment. Thus, the electronic devices equipped with one of the display systems are excellent in display performance and can provide normal image display.

As described above, according to a display system of the present invention, each first capacitor is disposed between each light-emitting power-supply line and a second electrode. Therefore, when the potential of a driving current flowing in the light-emitting power-supply lines is lowered, charges accumulated in the first capacitors are supplied to the light-emitting power-supply lines, that is, the charges compensate the shortage of the potential of driving current, to suppress change in potential. Thus, the display system can normally display images.

Furthermore, according to a display system of the present invention, the light-emitting power-supply lines include first lines and second lines, and each second capacitor is disposed between each first line and each second line. Therefore, when the potential of a driving current flowing in the light-emitting power-supply lines is lowered, charges accumulated in the second capacitors are supplied to the light-emitting power-supply lines to suppress change in potential. Thus, the display system can normally display images.

What is claimed is:

1. A display system, comprising:
   a substrate;
   a first electrode region having switching elements and first electrodes that are connected to the switching elements and are arranged on the substrate in a matrix;
   a light-emitting power-supply line that is arranged around the first electrode region and are connected to the first electrodes;
   functional layers, each of the functional layers being formed over a corresponding first electrode of the first electrodes; and
   a second electrode of which part is formed at least over the functional layers,
   a first capacitor being formed between the light-emitting power-supply line and the second electrode.

2. The display system according to claim 1, each light-emitting power-supply line and the second electrode facing each other to form the first capacitor outside the first electrode region.

3. The display system according to claim 2, each light-emitting power-supply line and the second electrode further including a first interlayer insulating layer therebetween.

4. The display system according to claim 1, further comprising:
   an actual display region including the first electrodes and a dummy region that is arranged around an actual display region and that does not contribute to display,
   the second electrode covering at least the actual display region and the dummy region, and each light-emitting power-supply line and the second electrode facing each other with the dummy region disposed therebetween to form the first capacitor.

5. The display system according to claim 4, the dummy region including dummy functional layers and dummy banks, and the dummy functional layers having a thickness smaller than that of the dummy banks.

6. The display system according to claim 5, each light-emitting power-supply line and each dummy functional layer of the dummy region having the first interlayer insulating layer therebetween.

7. The display system according to claim 1, the light-emitting power-supply lines each further including a first line and a second line facing each other with a second interlayer insulating layer therebetween, each first line being disposed at the same hierarchical level as that of lines of the second electrode, and each first line and each line of the second electrode having a second capacitor therebetween.

8. The display system according to claim 5, each functional layer further including a hole injection/transport layer and a light-emitting layer that is disposed adjacent to the hole injection/transport layer and comprises an organic electroluminescent material.

9. A display system, comprising:

a substrate;

a first electrode region having switching elements and first electrodes that are connected to the switching elements and are disposed on the substrate; and light-emitting power-supply lines that are arranged around the first electrode region and are connected to the first electrodes, functional layers that are formed over the first electrodes, a second electrode of which part is formed at least over the functional layers, and a first interlayer insulating layer is formed over the emitting power-supply lines, each light-emitting power-supply line and the second electrode facing each other with the first interlayer insulating layer located therebetween to form a first capacitor outside the first electrode region.

10. The display system according to claim 9, further comprising:

an actual display region including the first electrodes and a dummy region that is arranged around the actual display region and that does not contribute to display, the second electrode covering at least the actual display region and the dummy region, each light-emitting power-supply line and the second electrode facing each other with the dummy region disposed therebetween, and the dummy region having the first interlayer insulating layer.

11. The display system according to claim 10, the dummy region including dummy functional layers and dummy banks, and the dummy functional layers have a thickness smaller than a thickness of the dummy banks.

12. The display system according to claim 9, the light-emitting power-supply lines each further including a first line and a second line facing each other with a second interlayer insulating layer therebetween, each first line being disposed at a same hierarchical level as that of lines of the second electrode, and each first line and each line of the second electrode have a second capacitor therebetween.

13. The display system according to claim 9, each functional layer including a hole injection/transport layer and a light-emitting layer that is disposed adjacent to the hole injection/transport layer and comprising an organic electroluminescent material.

14. An electronic device, comprising:

the display system according to claim 1.

* * * * *